(12) United States Patent
Biswas et al.

(10) Patent No.: US 10,739,396 B2
(45) Date of Patent: Aug. 11, 2020

(54) ENHANCED DISTURBANCE MANAGEMENT OF A POWER GRID SYSTEM

(71) Applicant: General Electric Technology GmbH, Baden (CH)

(72) Inventors: Saugata Swapan Biswas, Pullman, WA (US); Manu Parashar, Seattle, WA (US); Anil Jampala, Bothell, WA (US)

(73) Assignee: General Electric Technology GmbH, Baden (CH)

( * ) Notice: Subject to any disclaimer, the term of this patent is extended or adjusted under 35 U.S.C. 154(b) by 243 days.

(21) Appl. No.: 15/719,287

(22) Filed: Sep. 28, 2017

(65) Prior Publication Data

US 2018/0095123 A1    Apr. 5, 2018

Related U.S. Application Data

(60) Provisional application No. 62/403,679, filed on Oct. 3, 2016.

(51) Int. Cl.
*G01R 31/08* (2020.01)
*H02J 13/00* (2006.01)
(Continued)

(52) U.S. Cl.
CPC ......... *G01R 31/088* (2013.01); *G01R 25/005* (2013.01); *G01R 31/086* (2013.01); *G08B 21/185* (2013.01); *H02J 13/0013* (2013.01); *H02J 13/0017* (2013.01); *G05B 15/02* (2013.01); *H02J 13/00001* (2020.01); *Y02E 60/74* (2013.01); *Y02E 60/7807* (2013.01); *Y04S 10/30* (2013.01); *Y04S 10/40* (2013.01); *Y04S 40/12* (2013.01)

(58) Field of Classification Search
CPC .... G01R 31/088; G01R 31/086; G05B 15/02; G08B 21/185; H02J 13/0013; H02J 13/0017
See application file for complete search history.

(56) References Cited

U.S. PATENT DOCUMENTS 9,092,593 B2 *  7/2015  Nasle .................... G06F 17/509
9,362,746 B2 *  6/2016  Shaffer .................... H02J 3/00
(Continued)

OTHER PUBLICATIONS

Mukhopadhyay, P., et al., "Disturbance Analysis Tool based on Synchrophasor Data," IEEE International Conference on Power Electronics, Drives and Energy Systems (PEDES), pp. 1-6 (2014).
(Continued)

*Primary Examiner* — Mohamed Charioui
(74) *Attorney, Agent, or Firm* — Fitch Even Tabin & Flannery LLP

(57) ABSTRACT

In example embodiments, there is provided enhanced disturbance management for an electrical power system. An enhanced disturbance management component can be operable to read monitoring data based on power flow measurements associated with measurement devices connected to an electrical power system, wherein the monitoring data can comprise alarm data indicative of an electrical disturbance within the electrical power system, and topology data indicative of a topology of the electrical power system. The enhanced disturbance management component can be operable to correlating the alarm data with a change in the topology data.

18 Claims, 16 Drawing Sheets

(51) Int. Cl.
  *G01R 25/00*   (2006.01)
  *G08B 21/18*   (2006.01)
  *G05B 15/02*   (2006.01)

(56) References Cited

U.S. PATENT DOCUMENTS

| | | | |
|---|---|---|---|
| 2006/0244585 A1* | 11/2006 | Bishop | H04L 41/0631 340/506 |
| 2010/0002348 A1 | 1/2010 | Donolo et al. | |
| 2012/0191440 A1 | 7/2012 | Meagher et al. | |
| 2014/0129746 A1 | 5/2014 | Zhou et al. | |
| 2014/0324369 A1 | 10/2014 | Yang et al. | |
| 2017/0046458 A1* | 2/2017 | Meagher | H02J 13/001 |

OTHER PUBLICATIONS

Nudell, T.R., et al., A Real-Time Attack Localization Algorithm for Large Power System Networks Using Graph-Theoretic Techniques, IEEE Transactions on Smart Grid, vol. 6, No. 5, pp. 2551-2559 (Sep. 2015).

Extended European Search Report and Opinion issued in connection with corresponding EP Application No. 17194513.2 dated Feb. 27, 2018.

European Application No. 17194513.2, Office Action, dated May 11, 2020, 5 pages.

Lin, Whei-Min, "Adaptive Multiple Fault Detection and Alarm Processing for Loop System With Probabilistic Network." IEEE Transactions on Power Delivery, vol. 19, No. 1, Jan. 2004, pp. 64-69.

\* cited by examiner

700

Real-time Disturbance Detection

| Latest Event | Event History | Event Summary & Statistics |

Last time EDM Starts: 26-DEC-2014 10:04:48 — 705
Last time EDM Ends:  26-DEC-2014 10:04:48

Real-Time Event Detection by EDM: — 710

| Alarms & Event Detection | ● PMU Alarm Detected |
| | ○ Topology Change Detection |
| | ○ New Event Detection |
| Last Time an Event was Detected: | 26-Dec-2014 10:04:00 |

Summary of EDM Data Source Update Times — 715

| Last Time PMU data was updated: | 26-Dec-2014 10:04:48 |
| Last Time SCADA data was updated: | 26-Dec-2014 10:04:48 |

Summary of Event Statistics — 720

| Total Number of Events Detected: | 239 |
| Total Number of Load In & Out Disturbances Detected: | 42 |
| Total Number of Unit In & Out Disturbances Detected: | 60 |
| Total Number of Line In & Out Disturbances Detected: | 135 |

FIG. 7

Disturbance Impact at PMU Locations

| Latest Event | Event History | Event Summary & Statistics |

PMU Measurement Data Last Updated at: 26-Dec-2014 10:06:40
SCADA Measurement Data Last Updated: 26-Dec-2014 10:06:40

Disturbance Impact at PMU Locations

| PMU Location ST \| KV \| ND | PMU ID | DIF | ΔMW ▽ | ΔMVAR ▽ | PMU Data During Disturbance ΔV p.u. ▽ | ΔV p.u. ▽ | ΔFreq. ▽ | Data Quality |
|---|---|---|---|---|---|---|---|---|
| CANADA8 500kV Node 123 | BRN-7_10_1 | 100% | -1488.94 | 458.38 | 0.0931 | 0.9995 | 60.12 | ● Valid |
| WASHING3 500kV Node 128 | BRN-10_82_1 | 64.7% | 971.59 | -288.49 | 0.0059 | 1.0154 | 59.97 | ● Valid |
| OREGON8 500kV Node 128 | BRN-89_122_1 | 31.6% | -474.56 | 112.20 | -0.0067 | 1.0529 | 59.97 | ● Valid |
| OREGON7 500kV Node 128 | BRN-121_122_1 | 31.3% | -474.56 | 41.51 | 0.0006 | 1.0383 | 59.97 | ● Valid |
| CANADA2 500kV Node 128 | BRN-4_79_1 | 26.3% | -385.31 | -390.77 | 0.0131 | 1.0231 | 60.12 | ● Valid |
| CANADA1 500kV Node 128 | BRN-2_80_1 | 25.8% | -385.31 | -185.19 | 0.0051 | 1.0311 | 60.12 | ● Valid |

FIG. 9

Chronological Event History Archiving For Post-Event Analysis

| Latest Event | Event History | Event Summary & Statistics |

PMU Measurement Data Last Updated at: 26-Dec-2014 10:08:40 —1010
SCADA Measurement Data Last Updated: 26-Dec-2014 10:08:40

Event History —1015

—1000

| EVENT DETECTION TIME | | DISTURBANCE INFORMATION —1025 | | | | | | MOST IMPACTED PMU LOCATION —1030 | | |
|---|---|---|---|---|---|---|---|---|---|---|
| PMU ALARM -- TOP COHERENCY | DIST. TYPE | ST \| KV \| ND | EQUIP \| CB | ΔMW | ΔMVAR | ΔV p.u. | | ST \| KV \| ND | | PMU |
| 26-Dec-2014 10:04:00<br>High Coherency for Alarm Type: Frequency | LINE Out | CANADA8<br>500kV Node 123 | Equip ID: 7_10_1<br>CB ID: 7_10_1 | -1488.94 | 458.38 | 0.0931 | | CANADA8<br>500kV Node 123 | | PMU ID: BRN-7_10_1 |
| 26-Dec-2014 10:03:36<br>Low Coherency for Alarm Type: Frequency | LINE Out | CANADA3<br>500kV Node 19 | Equip ID: 6_28_1<br>CB ID: 6_28_1 | -1488.94 | 458.38 | 0.0931 | | CANADA8<br>500kV Node 123 | | PMU ID: BRN-7_10_1 |
| 26-Dec-2014 10:03:16<br>Low Coherency for Alarm Type: Frequency | LINE In | CANADA3<br>500kV Node 17 | Equip ID: 6_79_1<br>CB ID: 6_79_1 | -1488.94 | 458.38 | 0.0931 | | CANADA8<br>500kV Node 123 | | PMU ID: BRN-7_10_1 |
| 26-Dec-2014 10:03:00<br>Low Coherency for Alarm Type: Frequency | LINE Out | CANADA3<br>500kV Node 17 | Equip ID: 76_1<br>CB ID: 76_77_1 | -1488.94 | 458.38 | 0.0931 | | CANADA8<br>500kV Node 123 | | PMU ID: BRN-7_10_1 |
| 26-Dec-2014 05:21:04<br>High Coherency for Alarm Type: Frequency | UNIT In | CANADA4<br>20kV Node 1 | Equip ID: 22_1<br>CB ID: 77_78_1 | -1488.94 | 458.38 | 0.0931 | | CANADA8<br>500kV Node 123 | | PMU ID: BRN-7_10_1 |
| 26-Dec-2014 05:21:04<br>High Coherency for Alarm Type: Frequency | LOAD In | CANADA4<br>110kV Node 3 | Equip ID: 22_1<br>CB ID: 77_78_1 | -1488.94 | 458.38 | 0.0931 | | CANADA8<br>500kV Node 123 | | PMU ID: BRN-7_10_1 |

1305 receiving, by a device comprising a processor and memory, measurement data associated with measurement devices connected to an electrical power system, wherein the measurement data comprises: alarm data indicative of an electrical disturbance within the electrical power system, and topology data indicative of a change in a topology related to an arrangement of equipment in the electrical power system and a power status of the equipment

1310 correlating, by the device, the alarm data with the change in the topology

1315 determining, by the device, a causation of the electrical disturbance in the electrical power system based on the correlating of the alarm data with the change in the topology

1320 determining, by the device, a coherency indicator representative of the level of correlation between the alarm data and the change in topology

1325 determining, by the device, a disturbance impact factor reflective of an impact of the electrical disturbance on a location

FIG. 13

ENHANCED DISTURBANCE MANAGEMENT OF A POWER GRID SYSTEM

RELATED APPLICATION

This application claims priority to U.S. Provisional Patent Application No. 62/403,679, filed Oct. 3, 2016, titled "Enhanced Disturbance Management (EDM) Application," the entirety of which application is hereby incorporated herein by reference.

TECHNICAL FIELD

The disclosed subject matter relates generally to managing disturbances in an electrical power system (e.g., power grid system).

BACKGROUND

A power grid is a complex and dynamic system that is difficult to manage. Often times, a power grid can comprise numerous power grid devices and a complex system of transmission lines. Furthermore, a power grid is often integrated with other power grids, resulting in a large-scale power grid system. Steady-state stresses or dynamic stresses on a power grid can occur due to power transfers or outages. Therefore, a power grid is often vulnerable to potential blackouts, which might be caused by one or more disturbances in the grid. It is therefore desirable to determine inefficiencies or abnormalities associated with energy flow in the power grid, and further, to provide more wide area visibility to power system operators at the control center regarding different kinds of power grid disturbance events.

The above-described background relating to power grid systems is merely intended to provide a contextual overview of some current issues, and is not intended to be exhaustive. Other contextual information may become further apparent upon review of the following detailed description.

BRIEF DESCRIPTION OF DRAWINGS

Non-limiting and non-exhaustive embodiments of the subject disclosure are described with reference to the following figures, wherein like reference numerals refer to like parts throughout the various views unless otherwise specified.

FIGS. 7-11 illustrate example graphical user interfaces in accordance with aspects of the subject disclosure.

FIG. 13 illustrates an example method for performing enhanced disturbance management in a power grid system in accordance with aspects of the subject disclosure.

DETAILED DESCRIPTION

Figure 1:
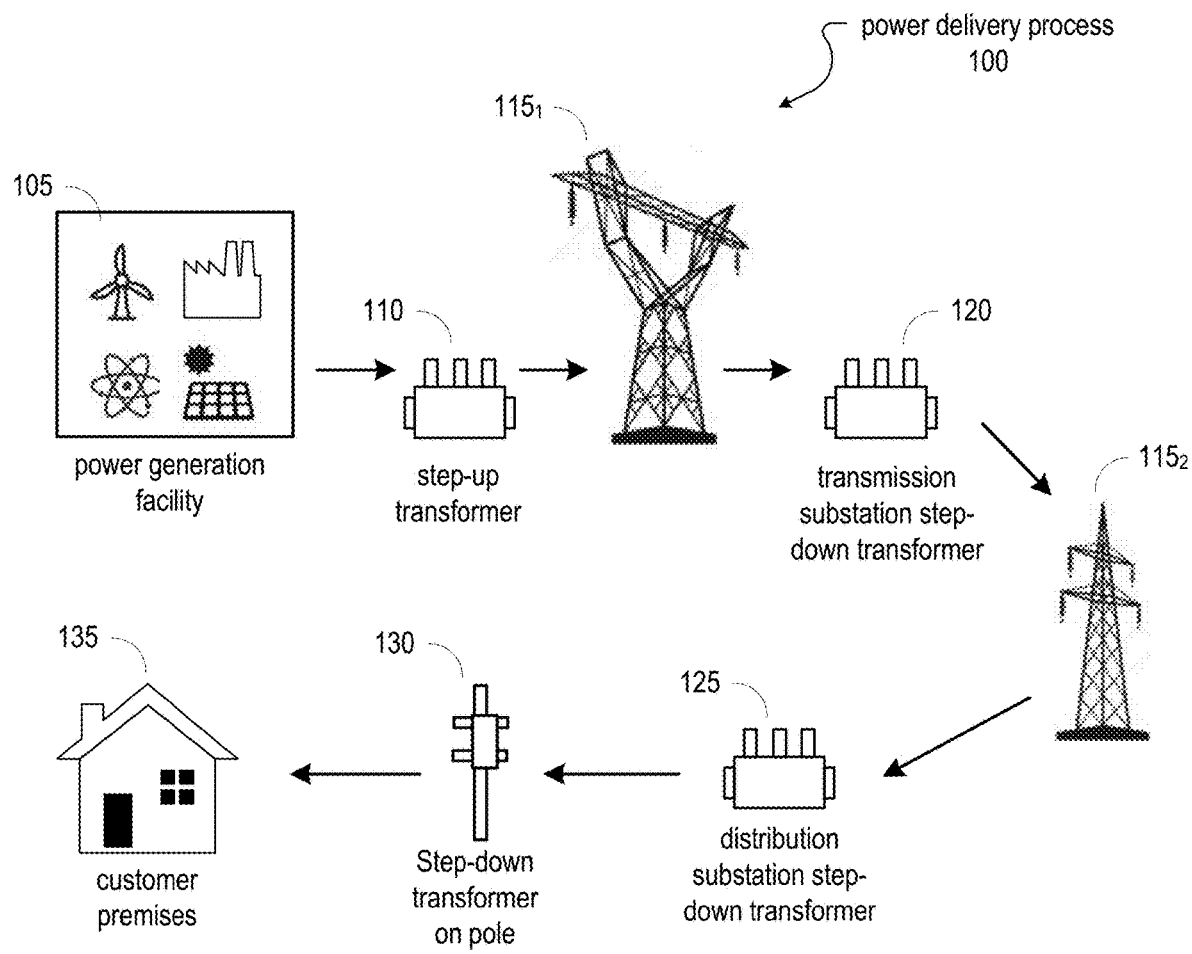
FIG. 1 illustrates a system that facilitates the delivery of electric energy to customer premises in accordance with aspects of the subject disclosure.

The subject disclosure is now described with reference to the drawings, wherein like reference numerals are used to refer to like elements throughout. In the following description, for purposes of explanation, numerous specific details are set forth in order to provide a thorough understanding of the subject disclosure.

The following description and the annexed drawings set forth in detail certain illustrative aspects of the subject matter. However, these aspects are indicative of but a few of the various ways in which the principles of the subject matter can be implemented or employed. Other aspects, advantages, and novel features of the disclosed subject matter will become apparent from the following detailed description when considered in conjunction with the provided drawings. In the following description, for purposes of explanation, numerous specific details are set forth to provide a understanding of the subject disclosure. It may be evident, however, that the subject disclosure may be practiced without these specific details. In other instances, well-known structures and devices are shown in block diagram form in order to facilitate describing the subject disclosure. For example, the methods (e.g., processes and logic flows) described in this specification can be performed by devices comprising programmable processors that execute machine executable instructions to facilitate performance of operations described herein. Examples of such devices can be devices comprising circuitry and components as described in FIG. 15 and FIG. 16.

As used in this application, the terms "component," "system," "platform," "interface," "node", "source", "agent", and the like, can refer to or can comprise a computer-related entity or an entity related to an operational machine with one or more specific functionalities. The entities disclosed herein can be either hardware, a combination of hardware and software, software, or software in execution. For example, a component may be, but is not limited to being, a process running on a processor, a processor, an object, an executable, a thread of execution, a program, or a computer. By way of illustration, both an application running on a server and the server can be a component. One or more components may reside within a process or thread of execution and a component may be localized on one computer or distributed between two or more computers. Also, these components can execute from various computer readable media having various data structures stored thereon. The components may communicate via local or remote processes such as in accordance with a signal having one or more data packets (e.g., data from one component interacting with another component in a local system, distributed system, or across a network such as the Internet with other systems via the signal).

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

A power grid system (e.g., power delivery system, an electrical power system) is a complex and dynamic system that is difficult to manage. Often times, a power grid system can comprise numerous power grid devices and a complex system of transmission lines. Furthermore, a power grid system is often integrated with other power grid systems, resulting in a large-scale power grid system. Steady-state stresses or dynamic stresses on a power grid can occur due to power transfers or grid outages in the power grid. Therefore, a power grid is often vulnerable to potential blackouts, which might be caused by one or more disturbances in the grid.

In example embodiments, there is provided systems and methods for enhanced disturbance management for an electrical power system. Among other operations, an Enhanced Disturbance Management (EDM) component (e.g., module) can be operable to read (e.g., obtain) monitoring data (e.g., Supervisory Control and Data Acquisition (SCADA) system data, Phasor Measurement Unit (PMU) based data, topology data, described further below) based on power flow measurements associated with measurement devices (e.g., PMUs (also referred to as PMU devices), current sensors, voltage sensors, etc.) connected to an electrical power system (e.g., electric power system, electrical energy system, electric energy system, power grid system, etc.), wherein the monitoring data can comprise alarm data indicative of an electrical disturbance within the electrical power system, and topology data indicative of a topology of the electrical power system. The EDM component can be operable to correlate the alarm data, which can relate to, for example, an angle disturbance alarm, or, for example, a frequency disturbance alarm, with a change in the topology data.

Further functions can comprise determining a characterization (e.g., classification, causation) of the electrical disturbance in the power grid system based on the correlating of the alarm data with the topology data, determining a coherency level representative of the degree of correlation between the alarm data and the topology data, determining a Disturbance Impact Factor (DIF; described further below) indicative of an impact of the electrical disturbance on a location in the power grid system; and determining whether the electrical disturbance is part of a local disturbance event or a wide-spread disturbance event. The EDM component can also store and display disturbance history, event history, and a variety of other statistical information related to disturbances and events, including on a graphical user interface, or in a generated report.

FIG. 1 is a diagram illustrating example embodiments of a power delivery process 100 showing components that can facilitate the generation of power and the process of delivering power (e.g., delivering energy, electricity) to customer premises. Electric power can be generated at a power generation facility, and then carried by transmission power lines to substations having transformers. A local distribution system of smaller, lower-voltage transmission lines and substations carry power to the customer premises.

Power generation facility 105 generates electricity to meet the power demands of customers. A variety of facilities can generate electricity. Power generation facilities 105 can comprise power plants that burn coal, oil, or natural gas. Power generation facilities 105 can also comprise nuclear power plants, hydroelectric dams, wind turbines, and solar panels. The location of these electricity generators, and their distance from end users, can vary widely.

After electricity has been generated by the power generation facility 105, transformers (e.g., step-up transformer 110), typically located at power plant substations adjacent to (and connected via power lines to) the power plant, will "step up" the voltage of the electricity. When power travels through power lines (e.g., metallic wires that conduct electricity), some of that power is wasted in the form of heat. The power loss is proportional to the amount of current being carried. Power companies keep the current low and compensate by stepping up the voltage.

After the voltage is stepped up, the electricity is typically carried over long distances by high voltage power transmission lines, typically supported and elevated by transmission towers (e.g., transmission tower $115_1$, $115_2$) that can be of various dimensions, materials, and heights.

Still referring to FIG. 1, the voltage is gradually reduced by step-down transformers as the electricity approaches customer premises. Transmission substations contain step-down transformers (e.g., transmission substation step-down transformer 120) that reduce the voltage of the electricity. The electricity can then be distributed on lower-voltage power lines. A typical transmission substation can serve tens of thousands of customers.

The electricity leaving transmission substations can travel through power lines to distribution substations. Distribution substations contain step-down transformers (e.g., distribution substation step-down transformer 125) that further reduce the voltage of electricity and distribute the power to cities and towns through main power lines, which can serve hundreds of customers. Distribution lines carry lower voltage power to clusters of homes and businesses, and are typically supported by wooden poles. Of note, power lines can also be buried under the ground.

Of note, substations can contain a variety of other equipment, including switches, breakers, regulators, batteries, etc.

The voltage from a branch line can further be reduced by transformers that are mounted on poles (e.g., step-down transformer on pole 130) that connect customer premises (e.g., customer premises 135) through a service drop power line.

Customer premises 135 can be of any type and variety. Customer premises can be a residential customer premises, such as residential houses. Customer premises can be an industrial customer premises, such as factories. Customer premises can be commercial customer premises, such as an office building. If a particular customer premises has a heavier load (e.g., has a higher demand for power), then a larger transformer, instead of a pole transformer, might service that particular customer premises.

Figure 2:
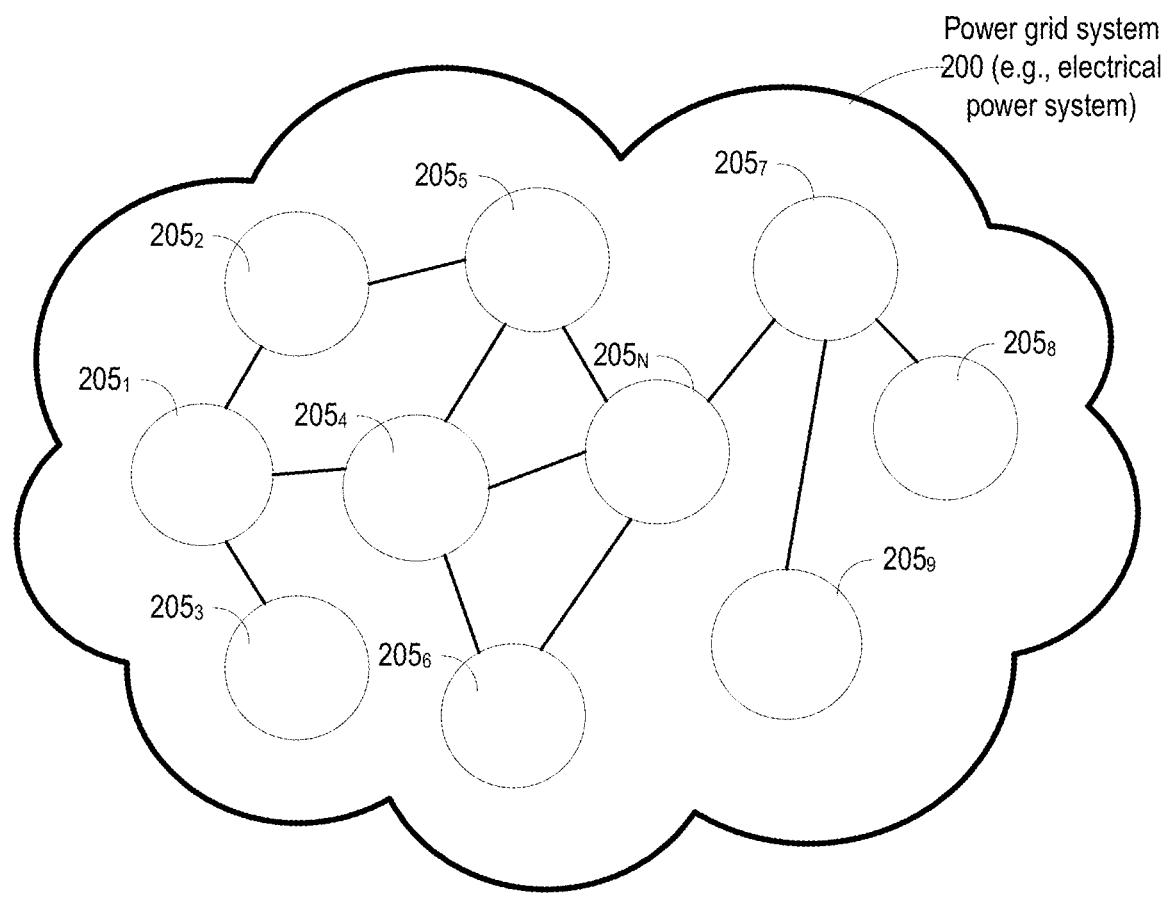
FIG. 2 illustrates an example of power grid system topology arrangements, interconnections, and architecture in accordance with aspects of the subject disclosure.

FIG. 2 depicts an illustration of a power grid system 200 (e.g., an electrical power system) comprising multitudes of nodes $205_{1-N}$, wherein a node can comprise a power generation facility, transmission substation, or a distribution substation, and is intended to convey that such facilities and substations can be interconnected. A power grid system 200 can follow a structural topology, influenced by factors such as budget, system reliability, load demand (demand for power), land, and geology. The structural topology in many cities and towns, for example many of those in North America, tends to follow a classic radial topology. This is a tree-shape wherein power from a larger voltage lines and substations radiates out into progressively lower voltage lines and substations until the customer premises are reached. A substation receives its power from a power generation facility, the power is stepped down with a transformer and sent through lines that spread out in all directions across the countryside. These feeders carry three-phase power and tend to follow major streets near the substation. As the distance from the substation grows, the fanout continues as smaller laterals spread out to cover areas missed by the feeders. This tree-like structure grows outward from the substation, but a single power failure can render inoperable entire branches of the tree. For reliability reasons, there are often unused backup connections from one substation to a nearby substation. This backup connection can be enabled in case of an emergency, such that a part of a substation's service area can be fed by another substation in case of any power failure events. Redundancy allows line failures to occur and power to be rerouted while workmen restore to service damaged or deactivated components. Neighboring power utilities also typically link their grids, thereby assisting one another to maintain a balance between power generation supply and loads (e.g., customer demand). Other topologies can be mesh topologies, looped systems (mostly found in Europe) and ring networks.

The result can be interconnected power grid systems that can form complex networks of power plants and transformers connected by hundreds of thousands of miles of high-voltage transmission lines. While these interconnections can be useful in situations, the danger or risk can comprise the possibility that a shutdown in one sector could rapidly spread to other sectors, leading to massive power failures in a wide area. The blackout of 2003 impacting several states in the northeastern United States highlighted the extent to which power systems have become interconnected over time, and the significant effect that the resulting interactions and interconnections could have on power delivery across multiple regions. The power outage impacted tens of millions of people and tens of thousands of megawatts (MW) of electric load. Some portions of the United States remained without electrical power for up to four days.

Figure 3:
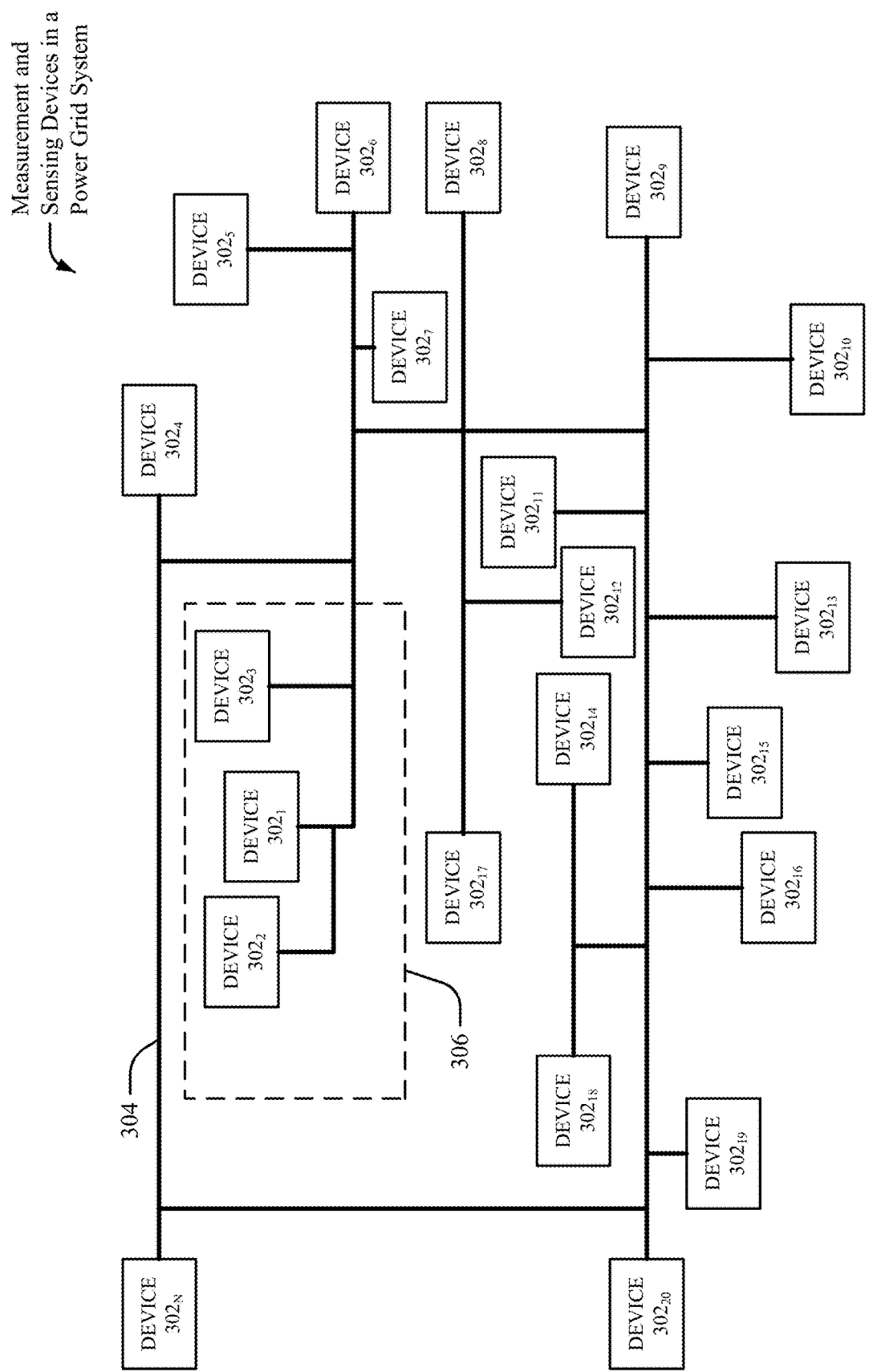
FIG. 3 illustrates measurement devices (e.g., sensing devices) in a power grid system in accordance with aspects of the subject disclosure.

FIG. 3 illustrates measurement devices $302_{1-N}$ of a power grid system 200 in accordance with aspects of the subject disclosure. Throughout a power network, a variety of sensors, monitoring devices and measurement devices (collectively referred to herein as "measurement devices") can be located at one or more nodes (e.g., nodes $205_{1-N}$), and that can be used to provide monitoring data related to power flow measurements, or monitor the condition of one or more aspects of a power grid system. A majority of measurement devices (e.g., measurement devices $302_{1-N}$) deployed in the electric power system are located within, or adjacent to, power transmission components (e.g., generating units, transformers, circuit breakers), including at substations. Measurement devices can also be deployed along distribution lines. These sensors help measure a range of parameters such as voltage, current, harmonic distortion, real and reactive power, power factor, and fault current. Examples of some sensors comprise: voltage and current sensors; PMUs; transformer-Metal Insulated Semiconducting (MIS) gas in oil sensors; circuit breaker sulfur hexafluoride density sensors; conductor temperature and current sensors that record overhead transmission conductor temperatures and current magnitudes; overhead insulator leakage current sensors; Transmission Line Surge Arrester (TLSA) sensors.

In FIG. 3, a power grid system 200 can comprise measurement devices $302_{1-N}$ located in various parts (e.g., such as nodes) throughout the grid. The measurement devices $302_{1-N}$ can be coupled via a network of transmission lines, as well as through wireless and wired communications mediums (e.g., cellular, ethernet, etc.). For example, measurement device $302_N$ and device $302_4$ can be coupled via a transmission line 304 from a network of transmission lines associated with the devices $302_{1-N}$. Furthermore, a subset of the measurement devices $302_{1-N}$ can be associated with a sector of the power grid system 200. For example, a sector 306 of the power grid system 200 can comprise measurement device $302_1$, measurement device $302_2$ and measurement device $302_3$. In one example, the sector 306 can be a corridor of the power grid system 200. Measurement devices are described further below.

In example embodiments, the reliability of the power grid system 200 can be facilitated through the use and analysis of the data received from measurement devices $302_{1-N}$ and monitoring of system conditions that are then communicated to a central control center, where a combination of automated actions and human decision assist in striving to ensure that the power grid system 200 is stable and balanced.

Figure 4:
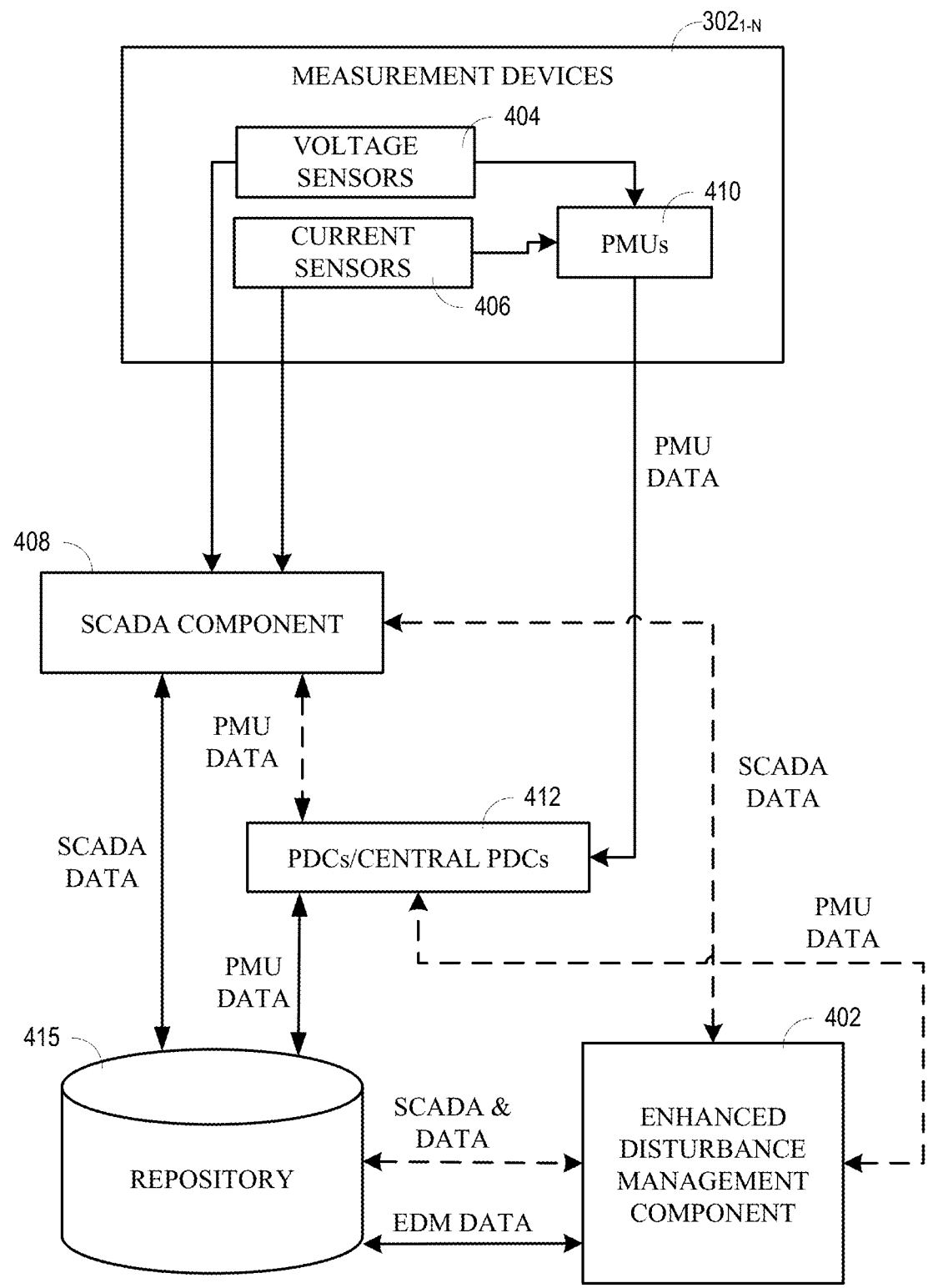
FIG. 4 illustrates a system comprising an Enhanced Disturbance Management (EDM) module (e.g., component) in accordance with aspects of the subject disclosure.

Referring now to FIG. 4, the EDM component 402 can be a module of, or can be associated with, a power grid management system (e.g., a Wide Area Monitoring System (WAMS; also referred to as a Wide Are Management system), a SCADA system, an Energy Management System (EMS), and other such applications). The EDM component 402 can be operable to use monitoring data (e.g., SCADA data, PMU data, topology data, etc.) to provide in-depth, real time wide area visibility to power system operators at the control center about different kinds of system disturbance events. It localizes and characterizes the disturbance events, evaluates the impact of the disturbances at specified locations (e.g., determines a Disturbance Impact Factor (DIF, described below)), archives this information chronologically (for post-event analysis), and provides relevant statistical details. The EDM component 402 can comprise software, hardware, or a combination of both (e.g., a computing device comprising a processor and a memory that stores executable instructions that, when executed by the processor, facilitate performance of operations described herein). The EDM component 402 is further described below, including with respect to FIG. 5, methods and functions described in flowcharts, and graphical user interfaces displaying various data.

Measurement devices $302_{1-N}$ in FIG. 4 can obtain, monitor or facilitate the determination of electrical characteristics associated with the power grid system (e.g., the electrical power system), which can comprise, for example, power flows, voltage, current, harmonic distortion, frequency, real and reactive power, power factor, fault current, and phase angles. Measurement devices $302_{1-N}$ can also be associated with a protection relay, a Global Positioning System (GPS), a Phasor Data Concentrator (PDC), communication capabilities, or other functionalities. It is to be appreciated that the measurement device 302 can be implemented as or associated with more than one measurement device.

Measurement devices $302_{1-N}$ can provide real-time measurements of electrical characteristics or electrical parameters associated with the power grid system (e.g., the electrical power system). The measurement device 302 can, for example, repeatedly obtain measurements from the power grid system (e.g., the electrical power system) that can be used by the EDM component 402. The data generated or obtained by the measurement device 302 can be coded data (e.g., encoded data) associated with the power grid system that can input (or be fed into) a traditional SCADA/EMS system. The measurement device 302 can also be a PMU that repeatedly obtains subs-second measurements (e.g., 30 times per second). Here, the PMU data can be fed into, or input into, applications (e.g., WAMS and WAMS-related applications) that can utilize the more dynamic PMU data (explained further below).

Still referring to FIG. 4 measurement devices $302_{1-N}$ can comprise voltage sensors 404 and current sensors 406 that feed data typically via other components, to, for example, a Supervisory Control and Data Acquisition (SCADA) system (e.g., SCADA component 408). Voltage and current magnitudes can be measured and reported to a system operator every few seconds by the SCADA component 408. The SCADA component 408 can provide functions such as data acquisition, control of power plants, and alarm display. The SCADA component can also allow operators at a central control center to perform or facilitate management of energy flow in the power grid system. For example, operators can use a SCADA component (for example using a computer such as a laptop or desktop) to facilitate performance of certain tasks such opening or closing circuit breakers, or other switching operations that might divert the flow of electricity.

Although not shown in FIG. 4, in example embodiments, the SCADA component 408 can receive measurement data from Remote Terminal Units (RTUs) connected to sensors in the power grid system, Programmable Logic Controllers (PLCs) connected to sensors in the power grid system, or a communication system (e.g., a telemetry system) associated with the power grid system. PLCs and RTUs can be installed at power plants, substations, and the intersections of transmission and distribution lines, and can be connected to various sensors, including the voltage sensors 404 and the current sensors 406. The PLCs and RTUs receive its data from the voltage and current sensors to which they are connected. The PLCs and RTUs can convert the measured information to digital form for transmission of the data to the SCADA component. In example embodiments, the SCADA component 408 can also comprise central host server or servers called master terminal units (MTUs), sometimes also referred to as a SCADA center. The MTU can also send signals to PLCs and RTUs to control equipment through actuators and switchboxes. In addition, the MTU can perform controlling, alarming, and networking with other nodes, etc. Thus, the SCADA component 408 can monitor the PLCs and RTUs, and can send information or alarms back to operators over telecommunications channels.

The SCADA component 408 can also be associated with a system for monitoring or controlling devices in the power grid system, such as an Energy Management System (EMS). An EMS can comprise one or more systems of computer-aided tools used by operators of the electric power grid systems to monitor, control, and optimize the performance of the generation or transmission system. Often, an EMS is also referred to as SCADA/EMS or EMS/SCADA. In these respects, the SCADA/EMS or EMS/SCADA can also perform the functions of a SCADA. Or, a SCADA can be operable to send data (e.g., SCADA data) to the EMS, which can in turn provide the data to the EDM component 402.

Other systems with which the EDM component 402 can be associated can comprise a situational awareness system for the power grid system, a visualization system for the power grid system, a monitoring system for the power grid system or a stability assessment system for the power grid system.

The SCADA component 408 can generate or provide SCADA data (e.g., SCADA DATA shown in FIG. 4) comprising, for example, real-time information (e.g., real-time information associated with the devices in the power grid system) or sensor information (e.g., sensor information associated with the devices in the power grid system) that can be used by the EDM component 402. The SCADA data, can be stored, for example, in repository 415 (described further below). In example embodiments, data determined or generated by the SCADA component 408 can be employed to facilitate generation of topology data (topology data is further described below) that can be employed by the EDM component 402 for enhanced disturbance management, which is further described below.

The employment of current sensors and voltage sensors allow for fast response. Traditionally, the SCADA component 408 monitors power flow through lines, transformers, and other components relies on the taking of measurements every two to six seconds, and cannot be used to observe the dynamic characteristics of the power system because of its slow sampling rate (e.g., cannot detect the details of transient phenomena that occur on timescales of milliseconds (one 60 Hz cycle is 16 milliseconds). Additionally, although SCADA technology enables some coordination of transmission among utilities, the process can be slow, especially during emergencies, with much of the response based on telephone calls between human operators at the utility control centers. Furthermore, most PLCs and RTUs were developed before industry-wide standards for interoperability were established, and as such, neighboring utilities often use incompatible control protocols.

Still referring to FIG. 4, measurement devices $302_{1-N}$ can also comprise Phasor Measurement Units (PMUs) 410. A PMU 410 can be a standalone device or may be integrated into another piece of equipment such as a protective relay. PMUs 410 can be employed at substations, and can provide input into one or more software tools (e.g., WAMS, SCADA, EMS, and other applications). A PMU 410 can use voltage and current sensors (e.g., voltage sensors 404, current sensors 406) that can measure voltages and currents at principal intersecting locations (e.g., substations) on a power grid using a common time source for synchronization, and can output accurately time-stamped voltage and current phasors. The resulting measurement is often referred to as a synchrophasor (although the term synchrophasor refers to the synchronized phasor measurements taken by the PMU 410, some have also used the term to describe the device itself). Because these phasors are truly synchronized, synchronized comparison of two quantities is possible in real time, and this time synchronization allows synchronized real-time measurements of multiple remote measurement points on the grid. In addition to synchronously measuring voltages and currents, phase voltages and currents, frequency, frequency rate-of-change, circuit breaker status, switch status, etc., the high sampling rates (e.g., 30 times a second) provides "sub-second" resolution in contrast with SCADA-based measurements. These comparisons can be used to assess system conditions-such as: frequency changes, power in megawatts (MW), reactive power in mega volt ampere reactive (MVARs), voltage in kilovolts (KV), etc. As such, PMU measurements can provide improved visibility into dynamic grid conditions and can allow for real-time wide area monitoring of power system dynamics. Further, synchrophasors account for the actual frequency of the power delivery system at the time of measurement. These measurements are important in alternating current (AC) power systems, as power flows from a higher to a lower voltage phase angle, and the difference between the two relates to power flow. Large phase angle differences between two distant PMUs can indicate the relative stress across the grid, even if the PMUs are not directly connected to each other by a single transmission line (for example, in the 2003 blackout mentioned above, the phase angles diverged prior to the blackout). This phase angle difference can be used to identify power grid instability, and a PMU can be used to generate an angle disturbance alarm (e.g., angle difference alarm) when it detects a phase angle difference. Examples of disturbances that might cause the generation of an angle disturbance alarm can comprise, for example, a line out or line in disturbance (e.g., a line out disturbance in which a line that was in service has now gone out of service, or in the case of a line in disturbance, in which case a line that was out of service has been brought back into service). PMUs can also be used to measure and detect frequency differences, resulting in frequency alarms being generated. As an example, unit out and unit in disturbances can result in the generation of a frequency alarm (e.g., a generating unit was in service, but might have gone out of service, or a unit that was out of service has come back in to service—both can cause frequency disturbances in the system that can result in the generation of a frequency alarm.). Still yet, PMUs can also be used to detect oscillation disturbances (e.g., oscillation in the voltage, frequency, real power—any kind of oscillation), which can result in the generation of an alarm (e.g., oscillation alarm). Several other types of alarms can be generated based on PMU data from PMU based measurements. Although the disturbances mentioned (e.g., line in/out, unit in/out, load in/out) can result in angle or frequency disturbance alarms, an angle or frequency disturbance alarm might not necessarily mean that a particular type of disturbance occurred, only that it is indicative of that type of disturbance. For example, if a frequency disturbance alarm is detected, it might not necessarily be a unit in or unit out disturbance, but may be a load in or load out disturbance.

The measurement requirements and compliance tests for a PMU 410 have been standardized by the Institute of Electrical and Electronics Engineers (IEEE), namely IEEE Standard C37.118.

Still referring to FIG. 4, in example embodiments, one or more Phasor Data Concentrators (PDCs), which can comprise local PDCs at a substation, 412 can be used to receive and time-synchronized PMU data from multiple PMUs 410 to produce a real-time, time-aligned output data stream. A PDC can exchange phasor data with PDCs at other locations. Multiple PDCs can also feed phasor data to a central PDC, which can be located at a control center. Through the use of multiple PDCs, multiple layers of concentration can be implemented within an individual synchrophasor data system. The PMU data collected by the PDC 412 can feed into other systems, for example, a central PDC, corporate PDC, regional PDC, the SCADA component 408 (optionally indicated by a dashed connector), energy management system (EMS), synchrophasor applications software systems, a WAMS, the EDM component 402, or some other control center software system. With the very high sampling rates (typically 10 to 60 times a seconds) and the large number of PMU installations at the substations that are streaming data in real time, most phasor acquisition systems comprising PDCs are handling large amounts of data. As a reference, the central PDC at Tennessee Valley Authority (TVA), is currently responsible for concentrating the data from over 90 PMUs and handles over 31 gigabytes (GBs) of data per day.

Still referring to FIG. 4, the measurement devices 302, SCADA component 408, and PDCs/Central PDCs, can provide data (e.g., real-time data associated with devices, meters, sensors or other equipment in the power grid system) (including SCADA data and topology data), that can be used by the EDM component 402 for enhanced disturbance management.

Both SCADA data and PMU data can be stored in one or more repositories 415. In some example embodiments, the SCADA data and PMU data can be stored into the repository 415 by the SCADA component 408, or by the PDC 412. In other embodiments, the EDM component 402 can have one or more components or modules that are operable to receive SCADA data and PMU data and store the data into the repository 415 (indicated by dashed lines). The repository can comprise a local repository, or a networked repository. The data on the repository 415 can be accessed by SCADA component 408, the PDCs 412, others systems (not shown), and optionally by example embodiments of the EDM component 402. In example embodiments, the EDM component can be operable to send instructions to one or more other systems (e.g., SCADA component 408, PDCs 112) to retrieve data stored on the repository 415 and provide it to the EDM component 402. In other embodiments, the EDM component 402 can facilitate retrieval of the data stored in repository 415 directly.

In example embodiments, the data stored in the repository 415 can be associated SCADA data and PMU data. The data can be indicative of measurements by measurement devices $302_{1-N}$ that are repeatedly obtained from a power grid system. In example embodiments, the data in repository 415 can comprise PMU/SCADA-based equipment data, such as, for example, data associated with a particular unit, line, transformer, or load within a power grid system (e.g., power grid system 200). The data can comprise voltage measurements, current measurements, frequency measurements, phasor data (e.g., voltage and current phasors), etc. The data can be location-tagged. For example, it can comprise a station identification of a particular station in which a power delivery device being measured is located (e.g., "CANADA8"). The data can comprise a particular node number designated for a location (e.g., "Node 3"). The data can comprise the identity of the measure equipment (e.g., the identification number of a circuit breaker associated with an equipment). The data can also be time-tagged, indicating the time at which the data was measured by a measurement device. The PMU/SCADA-based equipment data can also contain, for example, information regarding a particular measurement device (e.g., a PMU ID identifying the PMU from which measurements were taken).

In example embodiments, the data stored in repository 415 can comprise not only collected and measured data from various measurement devices $302_{1-N}$, the data can also comprise data derived from that collected and measured data. The data derived can comprise topology data (e.g., PMU/SCADA-based topology data), event data, and event analysis data, and EDM data (data generated by EDM component 402).

In example embodiments, the repository 415 can contain topology data (e.g., PMU/SCADA-based topology data) indicative of a topology for the power grid system 200. The topology of a power grid system can relate to the interconnections among power system components, such as generators, transformers, busbars, transmission lines, and loads.

This topology can be obtained by determining the status of the switching components responsible for maintaining the connectivity status within the network. The switching components can be circuit breakers that are used to connect (or disconnect) any power system component (e.g., unit, line, transformer, etc.) to or from the rest of the power system network. Typical ways of determining topology can be by monitoring of the circuit breaker status, which can be done using measurement devices and components associated with those devices (e.g., RTUs, SCADA, PMUs). It can be determined as to which equipment has gone out of service, and actually, which circuit breaker has been opened or closed because of that equipment going out of service. The topology data can be indicative of an arrangement (e.g., structural topology, such as radial, tree, etc.) or a power status of devices in the power grid system. Connectivity information or switching operation information originating from one or more measurement devices 302 can be used to generate the topology data. The topology data can be based on a location of devices in the power grid system, a connection status of devices in the power grid system or a connectivity state of devices in the power grid system (e.g., devices that receive or process power distributed in throughout the power grid system, such as transformers and breakers). For example, the topology data can indicate where devices are located, and which devices in the power grid system are connected to other devices in the power grid system (e.g., where devices in the power grid system are connected, etc.) or which devices in the power grid system are associated with a powered grid connection. The topology data can further comprise the connection status of devices (e.g., a transformer, etc.) that facilitate power delivery in the power grid system, and the statuses for switching operations associated with devices in the power grid system (e.g., an operation to interrupt, energize or de-energize or connect or disconnect) a portion of the power grid system by connecting or disconnecting one or more devices in the power grid system (e.g., open or close one or more switches associated with a device in the power grid system, connect or disconnect one or more transmission lines associated with a device in the power grid system etc.). Furthermore, the topology data can provide connectivity states of the devices in the power grid system (e.g., based on connection points, based on busses, etc.).

In example embodiments, the repository 415 can contain a variety of event and event analysis data, which can be derived based on PMU data, and in some embodiments, other data as well (e.g., SCADA data, other measurement data, etc.). The data can comprise information regarding events related to the power grid system 200. An event can comprise, for example, one or more disturbances to the power grid system. A disturbance can comprise, for example, a line disturbance (e.g., line in, or line out), a unit disturbance (e.g., unit in or unit out), or load disturbance (load in or load out). For each event, relevant information such as the station where the event occurred, the voltage level associated with the station (e.g., 500 kV), the node number related to the event, the equipment related to the event, the change in real and reactive power, and change in voltage per unit (e.g., p.u.) for the event.

The event and event analysis data can also comprise EDM data, which can be data related to events determined or derived by the EDM component 402 based on PMU data, SCADA data, equipment data, topology data, or event data. Such data can comprise real-time disturbance event data, such as the disturbance magnitude of an event, event spread (e.g., whether an event is local or wide area (e.g., wide-spread)), topology coherency (explained further below), the number of aggregate lines, loads, or units impacted, the location most impacted by the event, and the epicenter of the event. The EDM data can also comprise statistical data associated with events and disturbances that is generated by the EDM component 402. The statistical data can be at the event as well as disturbance level. The data can also comprise a historical archive of disturbance events, which can allow for post-event analysis, and for various reports to be generated based on the stored data.

The various data stored in one or more repositories 415, including equipment data, topology data, event data, event analysis data, EDM data, and other data, are described further below with respect to the various functionalities and operations that can be performed by the EDM component 402, and with respect to the user interfaces below.

Figure 5:
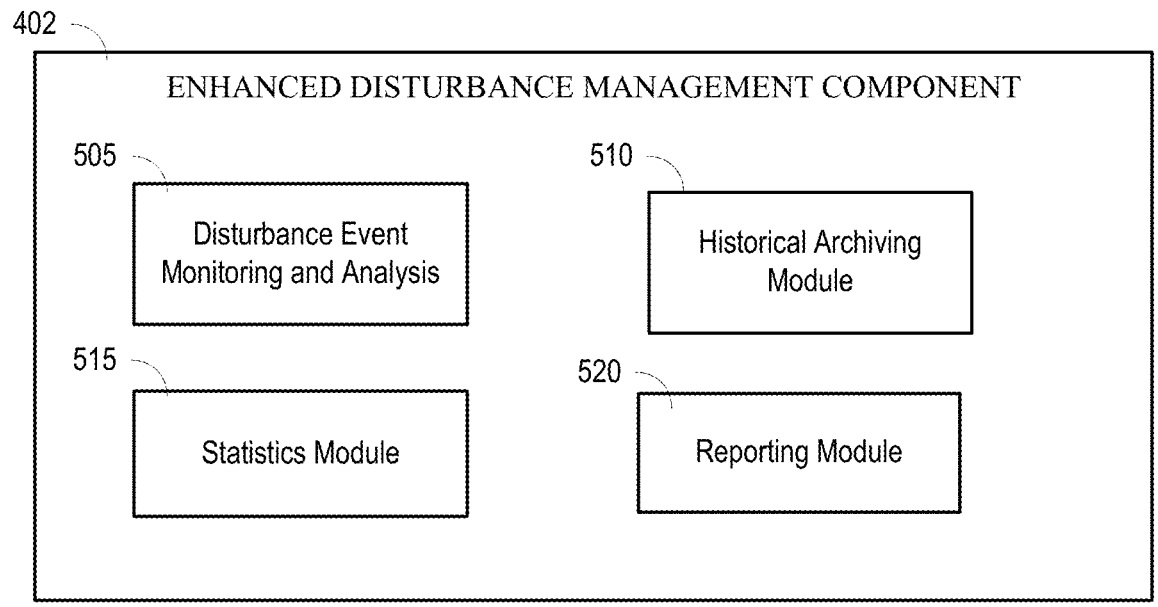
FIG. 5 is a high-level block diagram of an example EDM component in accordance with aspects of the subject disclosure.

Moving on to FIG. 5, a diagram of an example EDM component 402, in accordance with aspects of the subject disclosure, is shown. Aspects of the systems, apparatuses or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. In an aspect, the EDM component 402 can comprise memory for storing computer executable components and instructions. The EDM component 402 can further comprise a processor to facilitate operation of the instructions (e.g., computer executable components and instructions) by the EDM component 402. In some example embodiments, the EDM component 402 can comprise several modules for facilitating the performance of operations as described herein. In other example embodiments, the EDM component can be (or can be viewed as) one module that can facilitate the performance of operations as described herein. The EDM component 402 can comprise, for example, a disturbance event monitoring and analysis module 505, an historical archiving module 510, a statistics module 515, and a reporting module 520.

In response to an alarm, for example, when a PMU-based alarm is detected (e.g., an angle difference alarm or frequency disturbance alarm) the disturbance event monitoring and analysis module 505 of the EDM 402 can respond to the alarm by correlating the alarm with the change in topology (e.g., topology data such as equipment energization status, equipment connection status, etc.) of the system that potentially gave rise to that alarm. This correlation of PMU, equipment data, and topology data can provide context to an alarm, and can be used to associate information with the event that comprises the following: a disturbance epicenter; a disturbance magnitude; a disturbance impact; and an event spread.

The disturbance epicenter comprises information about the detection time of an event along with the epicenter of the event, including the exact cause (e.g., characterization) and location (e.g., localization) of the event, wherein an event can be comprised of one or more disturbances. In an event, a disturbance at one location can lead to a disturbance at another location, and so on. The event monitoring and analysis module 505 can not only account for equipment that has gone out of service, but also account for certain equipment that was out of service initially has come back into service. The characterization can be based on the device state as well as on the status change (in to out, or out to in). The disturbance event monitoring and analysis module 505 can attempt to determine a cause and categorize the disturbance as a line in/out, unit in/out, or load in/out, and also provide a coherency indicator that indicates how likely the disturbance is of a particular characterization.

To characterize a disturbance (or determine a cause for the disturbance, classify the disturbance, etc.) PMU data can be correlated with other data, such as SCADA data, which includes topology data. PMUs are monitoring the effect of something that happened on the grid (e.g., an angle disturbance alarm or a frequency disturbance alarm). SCADA data can provide information on the topology (e.g., topology data, e.g., where the unit, line, or a transformer, and what circuit breaker is connected or involved), and how the topology reacted to a disturbance (e.g., what are the topological changes that have taken place).

When a topological change has been determined, event monitoring and analysis module 505 of the EDM 402 associates that topological change with a PMU alarm (e.g., angle disturbance alarm, or frequency disturbance alarm), or vice versa.

As an example, if the disturbance is a unit out disturbance, resulting in a change in topology that indicates that a unit is out, there should also be a corresponding PMU-based frequency alarm associated with the unit out disturbance (as mentioned above, line in/out disturbances typically result in the generation of an angle disturbance alarm; unit in/out disturbances typically result in the generation of a frequency disturbance alarm; load in/out disturbances typically result in the generation of a frequency disturbance alarm). Likewise, if the disturbance is a line out (e.g., line outage), the correlating PMU-based alarm should be an angle disturbance alarm. In some scenarios, a frequency alarm may indicate that a line may have gone out and the breaker connected to the line has opened, but an interceding generator has gone out. In other instances, alarms can depend on the high/low settings that a user identity (e.g., a power system operator) has implemented. If a user has not configured settings properly, alarms might be generated, but a correlation with topology might show that there is nothing to worry about (e.g., a false positive). Data quality issues might also lead to false positives.

The disturbance event monitoring and analysis module 505 can also provide a coherency indicator that indicates how likely the disturbance is of a particular characterization. As mentioned above, PMU-based data can result in the generation an angle disturbance alarm, and can also generate a frequency disturbance alarm. As an example, if a frequency disturbance alarm is generated, and the event monitoring and analysis module 505 correlates the PMU alarm with a change in topology that indicated that a unit has come out of service, this correlation is high because generating unit trips can cause a frequency alarm. The coherency is thus indicated as high for frequency because the PMU alarm and the topology change both match well with a cause (unit out) and effect (frequency alarm).

The disturbance event monitoring and analysis module 505 can account for multiple scenarios. As another example, if a line has tripped, this disturbance will probably increase the angle separation across the line, but would not necessarily cause a frequency alarm. If an angle disturbance alarm has been generated, and the topology change shows that a line's status is that it has come out of service, the PMU angle disturbance alarm correlates highly with the topology change that took place, and thus the coherency for the angle disturbance alarm can be indicated as high.

An event can also comprise more than one disturbances, in which all the disturbances are part of one event. PMU detections (e.g., measurements) can result in the generation of alarms, and the continued generation of alarms for the same event. The disturbance event monitoring and analysis module 505 of the EDM 402 can utilize the topology data (e.g., the equipment status, the breaker status, the topology exchanged etc.) to determine if the disturbances are part of the same event. If in the subsequent cycles the topology does not change any more, despite still receiving new alarms, then that might be an indication that the same disturbances that are resulting the continuous generation of the alarms (e.g., as opposed to different disturbances associated with a different event impacting other locations). Overlapping (e.g., correlating, overlaying) the topology changes on top of the PMU based alarms can thus be a way to validate the alarms that are coming from the PMUs; PMU based alarms would still be generated, when there really are no more disturbances after a period of time.

In another example in which PMU based alarms can be correlated by the disturbance event monitoring and analysis module of the EDM 402, a transmission operator has a PMU at one of the boundaries of its own footprint (e.g., territory, corridor, etc.). If a neighboring transmission operator has had some line outages, then the responsibility of those line outages would not be under the responsibility of the transmission operator that has the PMU, but the PMU detection would still result in generation of alarms because electrically, the portion of the network having the PMU is still connected to the neighboring portion of the grid having the line outages, and the PMU might measure changes based on the out-of-territory line outages. So, the PMU detections would still result in the generation of alarms. But no data topology changes occurred in the portion of the network in which the PMU resides. This might be considered a false positive, because there is nothing for this operator to do because no disturbance has changed the part of the network that the operator is responsible for (e.g., the operator has no responsibility or control over equipment that is in a neighboring footprint).

In other scenarios, the PMU detections can result in a generation of an alarm, but the topology change does not correlate highly with the PMU alarm. For example, if a PMU-based frequency disturbance alarm is generated, and the topology change shows that a line has come out, then the disturbance event monitoring and analysis module 505 of the EDM 402 can determine that a line out should not necessarily cause a frequency alarm to be generated (but rather, and angle disturbance alarm). Thus, the frequency alarm does not correspond well to the topology change which shows that a line has come out of service. On the other hand, if the line out has caused islanding, which is a condition in which a distributed generator (DG) continues to power a location even though electrical grid power from the electric utility is no longer present, the disturbance event monitoring and analysis module 505 of the EDM 402 can look through the data available for indication of islanding, because a line outage with islanding can also cause a frequency disturbance alarm to be generated. If islanding is determined to be present, then the topology change and determination of islanding still correlates well with the frequency disturbance alarm, and thus the indicator can be "high coherency for frequency." However, if a line outage has happened, but no island has been formed, then the alarm may have been a false positive. A PMU is generating an alarm, but, based upon further analysis of the topology and other data, it should be an angle disturbance alarm, and not a frequency alarm. In that case, the frequency alarm coherency would be low. The EDM 402 can thus account for multiple scenarios based upon a PMU alarm, correlation of that alarm with topology data, and further correlation of the PMU alarm, topology data, and further analysis of other information.

Thus, the high coherency for frequency (and angle) alarms, and the low coherency for frequency (and angle) alarms can be based on whether the measurements of the alarms correlate properly with the topology changes. The ability for the disturbance event monitoring and analysis module 505 of EDM 402 to analyze PMU based alarm data and correlate the alarm data with topology and other data can not only point to a characterization (e.g., cause) for one or more disturbances, but also provide an indication of coherency (e.g., how strong or likely is the alarm correlated with the topology change and other data).

The information about the disturbance epicenter can be at a granularity level that comprises information regarding the epicenter of an event, for example, the disturbance type, the equipment, the circuit breaker, the name or designation of the station, the voltage level associated with the station (e.g., 500 kV), and the name or designation of the node. The information can be derived from using, for example, PMU data, SCADA Data, and topology data. As mentioned, differences in, for example, angle, frequency, etc. can inform as to whether there is a disturbance event, which might be a line in/out, unit in/out, or load in/out, each of which can lead to an impact on certain electrical parameters, comprising, for example, change in real power, reactive power, frequency, and voltage per unit. Time synchronized information reported by the $302_{1-N}$ can be used to determine which equipment was impacted first in time. Topology information can be used to determine whether other equipment (including at other stations or nodes) connected with the equipment that was impacted first in time also experienced a disturbance. An event can comprise one or more disturbances. The disturbance event monitoring and analysis module 505 can use topology information and time synchronized information, to determine that several equipment all connected together experienced a disturbance, and that one equipment was impacted first, and then a second equipment connected to the first one experienced a disturbance next, then a third equipment connected to the second. By making these determinations, an epicenter—the source of the event—can be determined.

While an event can comprise several disturbances, it might also be the case that more than one event has occurred. In an example scenario, it might be that the data shows that one event happened involving, for example, 5 pieces of equipment at 5 different nodes, while another event involved 8 other pieces of equipment at 8 other nodes. The PMU based alarms and topology information can be used to determine that the first 5 pieces of equipment are connected with one another, but that they are not connected to the 8 other pieces of equipment impacted by a second disturbance event. The time synchronization data can be used to determine which of the first 5 pieces of equipment was the first to experience the first disturbance, and also which of the second 8 pieces was first to experience the second disturbance, thus pointing to the epicenter of each event.

In addition to determining the characterization of a disturbance, location of a disturbance, and epicenter of a disturbance, the disturbance event monitoring and analysis module 505 can also be operable to provide a disturbance magnitude for each disturbance. At the point of each disturbance, during the transition from pre-disturbance state to post-disturbance state, disturbance magnitude information comprising information about the change in electrical parameters (e.g.—change in real power, change in reactive power, and change in voltage) can be determined by the disturbance event monitoring and analysis module 505. The magnitude information can be for the disturbance epicenter, for example. The magnitude information can also be for the most impacted PMU location, for example.

The disturbance event monitoring and analysis module 505 can also be operable to determine disturbance impact information, which can comprise information about the impact of the disturbance event at pre-specified and measured key locations in the system using a disturbance impact factor (DIF) metric, which can be a function of the change in power, voltage, real power, reactive power, and voltage, or some other parameter (e.g., electrical parameter, custom-designed parameter, etc.) with reference to the point of disturbance. The DIF reflects the impact of each disturbance in an event on a PMU location (based on user defined weights and steady-state changes in the power system parameters during the disturbance), and can be derived, for example, by using the example equation below:

$$DIF_{PMU\ Bus\ i} = W_i * \frac{\Delta P_{PMU\ Bus\ i}}{\Delta P_{Disturbance\ Bus\ i}} + W_2 * \frac{\Delta Q_{PMU\ Bus\ i}}{\Delta Q_{Disturbance\ Bus\ i}} + W_3 * \frac{\Delta V_{PMU\ Bus\ i}}{\Delta V_{Disturbance\ Bus\ i}}$$

In this equation, the $DIF_{PMU\ Bus\ i}$ is the disturbance impact factor associate with a particular PMU. It is calculated, for example, by multiplying weighting factor W1 multiplied against the change in real power of the PMU over the change in real power of the disturbance location, added to a weighting factor W2 multiplied against a change in quality Q at the PMU over the change in quality at the disturbance location, added to a weighting factor W3 multiplied against a change in voltage at the PMU over the change in voltage of the disturbance location. Each of the weighting factors W1, W2, and W3 can be set (e.g., set by a power systems operator). Again, other factors can be accounted for when calculating a disturbance impact factor, which can depend on customer or user choice or design.

The disturbance event monitoring and analysis module 505 can also be operable to determine event spread information. Event spread information can comprise information about the spread or scope of the event (e.g., whether the event is a local event or a wide area event). A local event can be an event wherein only one location (e.g., one substation) is impacted, whereas a wide-spread event can be an event in which multiple locations have been impacted. Event spread information can also include information as to whether the event involves different types of equipment (e.g., a line and a load simultaneously, etc.).

Still referring to FIG. 4, whenever a new event (comprising of one or more disturbances) takes place, each new disturbance gets appended (e.g., appended by the historical archiving module 510) to the event history archive in a chronological manner, which can enable a post-event analysis to be performed. The information archived for each disturbance can be as follows: event detection time; correlation of system topological disturbances in the event with PMU-based alarms; disturbance type, location, and magnitude; most impacted location (amongst the pre-specified list of key locations) due to the disturbance.

Still referring to FIG. 5, the statistics module 515 can maintain different statistical information at an event level as well as at a disturbance level. This can provide a good idea of the pattern of disturbances in the system, which in turn can assist with event probability-based planning.

Still on FIG. 5, a reporting module 520 can be operable to record all the information pertaining to all the disturbance events and their related statistical data (e.g., in a comma-separated values (CSV) format). The reporting module 520 can update the report whenever a new disturbance event is detected and analyzed. The report can be displayed in a number of formats, including on-line, or through an excel spreadsheet, wherein each column can have headings that comprise: Event Time, PMU Alarm Type (e.g., frequency, angle), Alarm-Topology Coherency (High/Low), Disturbed Station, Disturbance Equipment ID, Disturbance Circuit Breaker, Difference in real power, difference in reactive power, difference in voltage per unit, PMU station, PMU voltage level, PMU node, PMU ID, etc. Examples of each of these data elements corresponding to the headers appear in some of the user interface figures below.

In example embodiments, the EDM component 402, or one or more of its modules, can be associated with one or more other systems, such as, for example, an energy management system (EMS) for the power grid system. For example, the EDM component 402 can be a module of an EMS, or can be an application that communicates with modules of an EMS. As another example, the EDM component 402 can be an application, or module, associated with a WAMS system.

Figure 6:
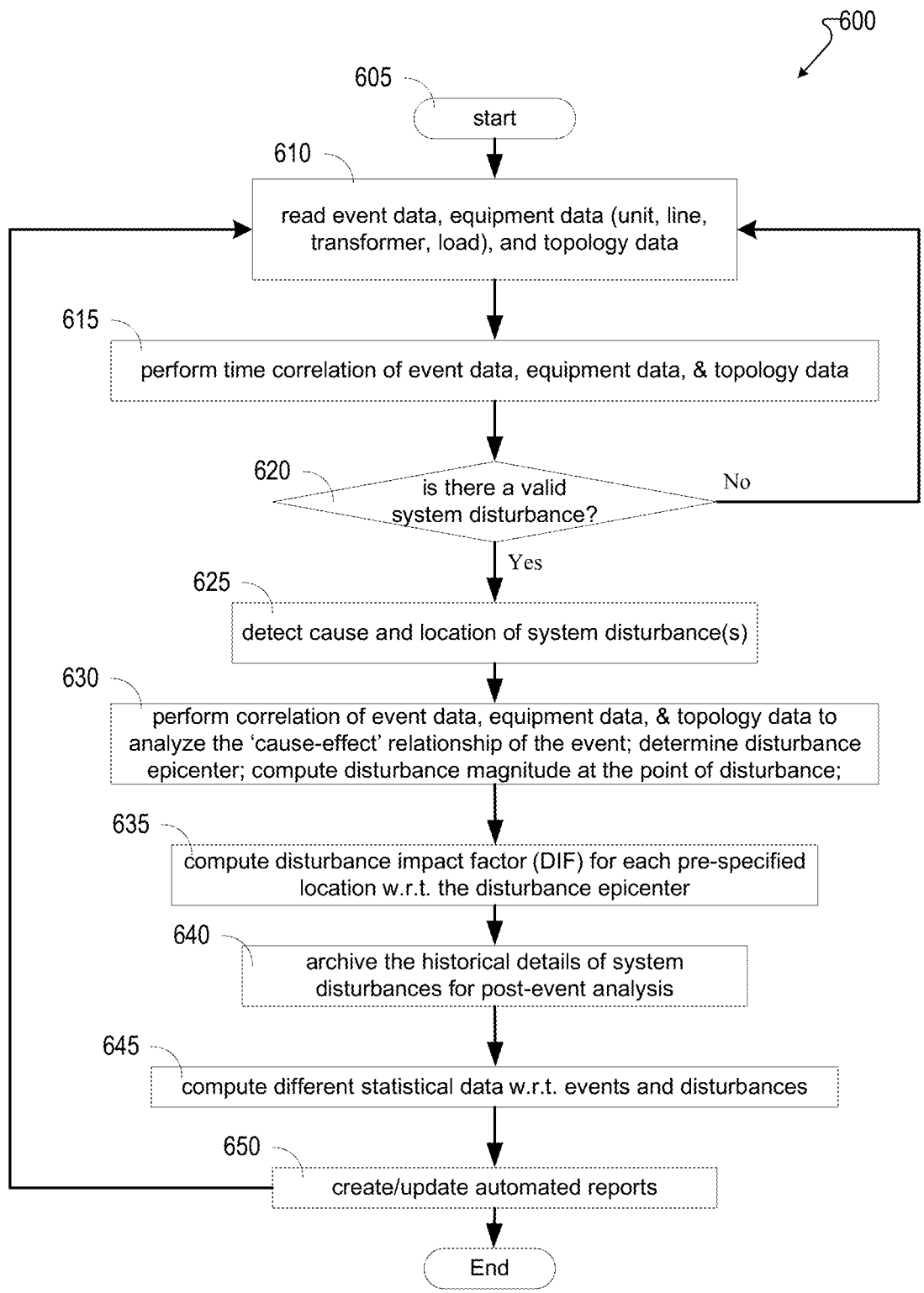
FIG. 6 illustrates an example operation that can be performed by an EDM component, and more specifically a disturbance event monitoring and analysis module of an EDM component in accordance with aspects of the subject disclosure.

FIG. 6 is a flow chart depicting example embodiments of operations that can be performed by the EDM component 402. As mentioned above, the EDM component 402 can comprise memory for storing computer executable components and instructions. The EDM component 402 can further comprise a processor to facilitate operation of the instructions (e.g., computer executable components and instructions).

The operations can begin at step 605. At step 610, the EDM component 402 can read a variety of data. For example, the EDM component 402 can read event data, equipment data, and topology data, which can be PMU-based or SCADA based, for example. The event data, equipment data, and topology data can be read from, for example, a repository (e.g., repository 415) accessible by the EDM component 402, either directly or indirectly. As an example of indirectly, data can be retried by the SCADA component 408 and PDCs 412 (as indicated by the dashed lines in FIG. 4), or other devices and applications (e.g., an EMS). The event data, equipment data, and topology data can comprise, for example, when and where an angle or frequency disturbance alarm has been generated, device connection, state, and status data, unit/line/load information, location information (e.g., the station, the voltage level of the station, node number etc.

Still referring to FIG. 6, the EDM at step 615 can perform a time correlation of event data, equipment data, and topology data, which can entail, for example, determining whether a PMU alarm corresponds to a change in topology (e.g., a topology change), during a particular time, or interval.

At 620, a determination can be made, based on the correlation, whether a valid system disturbance exists. As mentioned above, in some cases, PMU measurements can result in the continued generation of alarms for the same event. Or, as mentioned above, in some cases a PMU alarm does not correlate to any change in topology (which could indicate a false positive). As another example, PMU alarms might be generated outside of the region of responsibility of an operator. If there is no valid system disturbance, the operations can move to step 610 where the EDM 402 continues to constantly monitor and analyze new data.

If a valid system disturbance exists, at step 625 the EDM 402 can detect a cause (e.g., characterize the disturbance) and location of system disturbances. As an example, the EDM 402 can read data to determine the time of the disturbance, the equipment involved with the disturbance, and the change in topology of the disturbance (e.g., a line out at station CANADA 8, node 3, a 500 KV substation). The EDM 402 can then analyze the "cause and effect" relationship of the event, as described above with respect to FIG. 5 (e.g., the EDM 402 can determine whether a line out at a particular time corresponds to a PMU-based angle difference alarm, and assign a coherency level (high, low) to that alarm that indicates the degree of correlation, or likelihood, that, for example, the angle difference alarm was caused by the line out disturbance. Additionally, as mentioned above with respect to FIG. 5, a disturbance epicenter can be determined by the EDM 402. Additionally, a disturbance magnitude that includes information about the change in the electrical parameters (e.g. change in real power, change in reactive power, and change in voltage) at the point of disturbance during the transition from the pre-disturbance state to the post-disturbance state, can be determined by the EDM 402.

At step 635, the EDM 402 can determine the impact of the disturbance, and compute a disturbance impact factor (DIF) for each disturbance location, which would also include the disturbance epicenter and the most impacted location. The disturbance impact can include information about the impact of the disturbance event at pre-specified and measured key locations in the system using the DIF, an example equation for which is described above with respect to FIG. 5. The DIF reflects the impact of each disturbance in an event on a PMU location (based on user defined weights and steady-state changes in the power system parameters during the disturbance).

At step 640, the EDM 402 can archive the historical details of system disturbances for post-event analysis. The historical details can be stored in, for example, repository 415, and retrieved for display (e.g., FIG. 10). At step 645, different statistical data with respect to events and disturbances can be computed. The statistical data can be stored in, for example, repository 415, and retrieved for display (e.g., FIG. 11).

At step 650, the EDM 402 operations can comprise a step in which automated reports are created, and updated accordingly. As mentioned above with respect to FIG. 5, the data associated with the report can be stored in CSV format, and the report can be displayed on line, via an Excel spreadsheet, etc. The reporting module 520 can update the report whenever a new disturbance event is detected and analyzed.

The operations can loop to step 610 where more event, equipment, and topology data is read, such that the EDM 403 can continue to receive new data and update its analysis.

FIGS. 7-11 illustrate graphical user interfaces (GUIs) in accordance with example embodiments of the subject disclosure. For example, the graphical user interface 700 can be generated by or associated with the enhanced disturbance management component (e.g., EDM component 402). Furthermore, the graphical user interfaces can be associated with a display of a device (e.g., a computing device). A device associated with the graphical user interface 700 can comprise, for example, a computer, a laptop computer, a mobile device, a handheld device, a cellular phone (e.g., a smartphone), a tablet device, an interactive monitor, another type of device capable of displaying or presenting a graphical user interface, etc. The graphical user interfaces can provide various information associated with an EDM component 402.

FIG. 7 illustrates a GUI showing a real-time event detection GUI 700, the generation of which was facilitated by, for example, the EDM component 402. The GUI 700 can comprise the display 705 of the last time that the EDM component 402 was run (e.g., executed). In the example shown, display 705 shows that the EDM was last operational at a start time of Dec. 26, 2014 10:04:48 and an end time of Dec. 26, 2014 10:04:48. The GUI 700 can also display in an area a real-time event detection 710 by the EDM component 402. In the example shown, the real-time event detection 710 is that of a PMU alarm that was detected. The PMU alarm might have been triggered for a number of reasons, resulting in a change in frequency, phase angle, etc. that was significant enough to have triggered an alarm (the difference threshold for the alarm can be set). The alarm might have been caused by, for example, a fault, event, or maintenance record (e.g., line in/out, unit in/out, load in/out). As shown in FIG. 7, other real-time events detected by the EDM component 402 might be a change in topology (wherein the topology alarm might have been generated from an SCADA/EMS). If both a PMU alarm is detected, and a topology change alarm is detected, the "new event detection" indicator can be filled in, indicating that a PMU alarm also correlated with a topology change, and thereby the likelihood that an event (which can comprise one or more disturbances) has occurred. The GUI 700 can also display the last time an event was detected. In the example shown, the last time an event was detected was Dec. 26, 2014 at 10:04:00. In example embodiments, the GUI 700 also can display the last time the data sources used by the EDM component 402 were updated 715, wherein the data sources can be, for example, PMU-based data or SCADA-based data. In the example shown in FIG. 7, both the PMU data and the SCADA data were updated on Dec. 26, 2014 at 10:04:48. Providing an indication of the times in which the data used by the EDM component 402 was last updated can let a user identity of the EDM component know whether the data being displayed was based on recent (or, conversely, outdated) data. The GUI 700 can also display a summary of event statistics recorded by the EDM component 402. In the example shown, the total number of events detected was 239, the total number of load in & out disturbances detected (e.g., disturbances based on whether a load loss or restoration), unit in & out disturbances detected (e.g., whether a unit is going in or out of service), and the number of lines in & out disturbances detected (e.g., line trips), thus providing a brief summary of some of the disturbances encountered by the EDM component 402.

Figure 8:
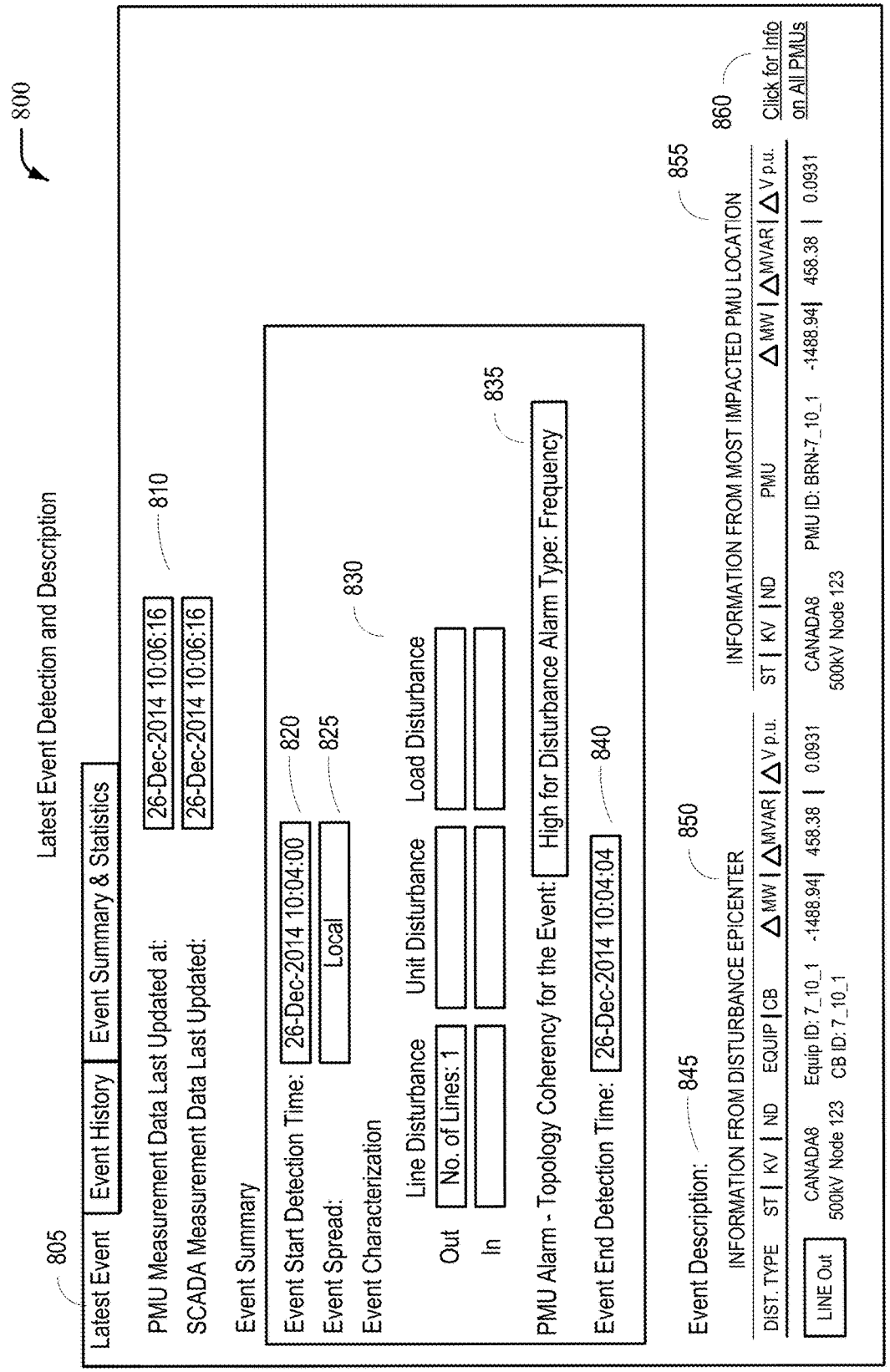

FIG. 8 illustrates a GUI showing a latest event GUI 800 that can display information related to detection and description of the latest event. The latest event GUI 800 can be presented when a user identity clicks on (or selects) the latest event tab 805. The GUI 800 can display the last time the data sources (e.g., PMU-based measurement data, SCADA measurement data) used by the EDM component 402 were updated 810. The latest event GUI 800 can comprise an event summary section 815. The event summary section 815 can display an event start detection time 820. As shown in the example in the figure, the event start time is Dec. 26, 2014 10:04:00, marking the time when the first disturbance associated with the event occurred. The event summary section 815 can also comprise an event spread indicator 825, indicating whether the event is local or wide-spread. A local event can be characterized as an event comprising disturbances impacting one location (e.g., one substation), while a wide-spread event can be an event having disturbances to many locations (e.g., many substations). The threshold for whether an event is local or wide-spread can vary, depending on what the operators set the threshold at. The event summary section 815 can comprise an event characterization sub-section 830, in which the number of lines, units, or loads out can be displayed; the number of lines, units, and loads in can also be displayed in the event characterization sub-section 830. In the example GUI shown, only one line disturbance is associated with the event, and it is a line out disturbance. The event summary section 815 can also contain information indicating the PMU alarm and topology coherency for the event 835. Here, in the example shown, the PMU alarm and topology coherency for the event is shown as "high for Disturbance Alarm Type: Frequency," which indicates that the PMU alarm is a frequency disturbance alarm, and that corresponding topology change (e.g., line out) and further analysis (e.g., determination of islanding) corresponds well with that frequency disturbance alarm. The event summary section 815 can also have an event end detection time indicator 840, which can indicate when the event's detection time ended. Here, in the example shown in FIG. 8, the event end detection time is indicated as Dec. 26, 2014 at 10:04:04.

Still referring to FIG. 8, the latest event GUI 800 can have an event description section 845. The event description section 845 can comprise information from the disturbance epicenter 850. The information from the disturbance epicenter 850 can comprise information such as, for example, the disturbance type at the epicenter (e.g., "Line Out"), the station (e.g., Canada8), the voltage level associated with the station (e.g., 500 KV), the node number (e.g., node 123), the equipment ID number (e.g., Equipment ID: 7_10_1), the change in power (e.g., $\Delta$MW, −1488.94), the change in reactive power ($\Delta$MVAR 458.38), and change in voltage per unit (e.g., $\Delta$V p.u. 0.0931). The event description section 845 can also comprise information from the most impacted PMU location 855. The information from the most impacted PMU location 855 can comprise information such as, for example, the station of the most impacted PMU location (e.g., Canada8), the voltage level associated with the station (e.g., 500 KV), the node number (e.g., node 123), the PMU ID number (e.g., PMU ID: BRN-7_10_1), the change in power (e.g., $\Delta$MW, −1488.94), the change in reactive power ($\Delta$MVAR 458.38), and change in voltage per unit (e.g., $\Delta$V p.u. 0.0931). The event description section 845 can also comprise a selectable link that can lead to the display of information for all PMU locations impacted by the event, not just the most impacted PMU location.

In the example shown in FIG. 8, only one disturbance was detected. However, a disturbance event can be comprised of multiple disturbances. If there was more than one disturbance corresponding to the event, more disturbances would appear in the event summary section (perhaps another line, unit, or load disturbance would be indicated), and also under event description 845, more than one row would appear, wherein each row would correspond with a disturbance related to the latest event. There might be different breakers associated with the different disturbances of the same event (e.g., the latest event), so all those different breaker IDs would be shown in each row.

FIG. 9 illustrates a GUI showing a disturbance impact at PMU locations GUI 900. The GUI 900 can display a section showing the last time the data sources (e.g., PMU measurement data, SCADA measurement data) used by the EDM component 402 were updated 905. The GUI 900 can have another section showing the disturbance impact at PMU locations 910. The information shown in the disturbance impact at PMU locations section 910 can comprise a chart. The chart can show, for example, the PMU location 915 for each PMU location impacted by the event disturbance(s), wherein the displayed PMU location 915 data can comprise an identification of the station (e.g., Canada8), the voltage level associated with the station (e.g., 500 KV), and the node number (e.g., Node 123). The disturbance impact at PMU locations section 910 can also display the PMU ID number 920 (e.g., BRN-7_10_1, BRN-10_82_1, etc.), and the disturbance impact factor for each impacted PMU location (e.g., 100%, 64.7%, etc.). The disturbance impact at PMU locations section 910 can also display PMU data during the disturbance, which can include, for example, the change in power (e.g., ΔMW, −1488.94), the change in reactive power (ΔMVAR 458.38), the change in voltage per unit (e.g., ΔV p.u. 0.0931), the voltage per unit (e.g., V p.u.), and the frequency. Each of the measurements (and change in measurements) of the PMU data during disturbance 930 can be sortable. For example, a user can select, or click on, a triangular shape to sort each measurement (and change in measurement) in ascending or descending order. In addition to the aforementioned measurements (and change in measurements), the PMU data during disturbance 930 can also be comprised of an indicator of data quality. As mentioned above, data quality issues can cause errors like, for example, false positives.

FIG. 10 illustrates a GUI showing an event history GUI 1000 showing a historical recording of all the disturbances associated with an event. Each disturbance can be sortable, for example, in chronological order. The event history GUI 1000 can be used for post-event analysis. The latest event detection and description GUI 1000 can be presented when a user identity clicks on (or selects) the latest event tab 1005. The GUI 1000 can display a section showing the last time the data sources (e.g., PMU measurement data, SCADA measurement data) used by the EDM component 402 were updated 1010. The event history GUI 1000 can comprise an event history section 1015. In example embodiments, under the event history section 1015, the event detection time and PMU alarm type 1020 can be displayed. As shown in FIG. 10, the first entry has an event detection time of Dec. 26, 2014 at 10:04:00, and the alarm type was related to frequency.

Still referring to FIG. 10, the event history section 1015 can also display disturbance information for an entry. As shown in the first entry of the event history section 1015 of FIG. 8, disturbance information can comprise, for example, the disturbance type (e.g., "Line Out"), the station (e.g., Canada8), the voltage level associated with the station (e.g., 500 KV), the node number (e.g., node 123), the equipment ID number (e.g., Equipment ID: 7_10_1), the circuit breaker (CB) ID number (e.g., CB ID: 7_10_1), the change in power (e.g., ΔMW, −1488.94), the change in reactive power (ΔMVAR 458.38), and change in voltage per unit (e.g., ΔV p.u. 0.0931). Also displayed for an entry can be the most impacted PMU location 1030. For example, for the first entry shown in FIG. 10, the most impacted PMU location 1030 can comprise the station (e.g., Canada8), the voltage level associated with the station (e.g., 500 KV), the node number (e.g., node 123), and the PMU ID number 920 (e.g., BRN-7_10_1).

Figure 11:
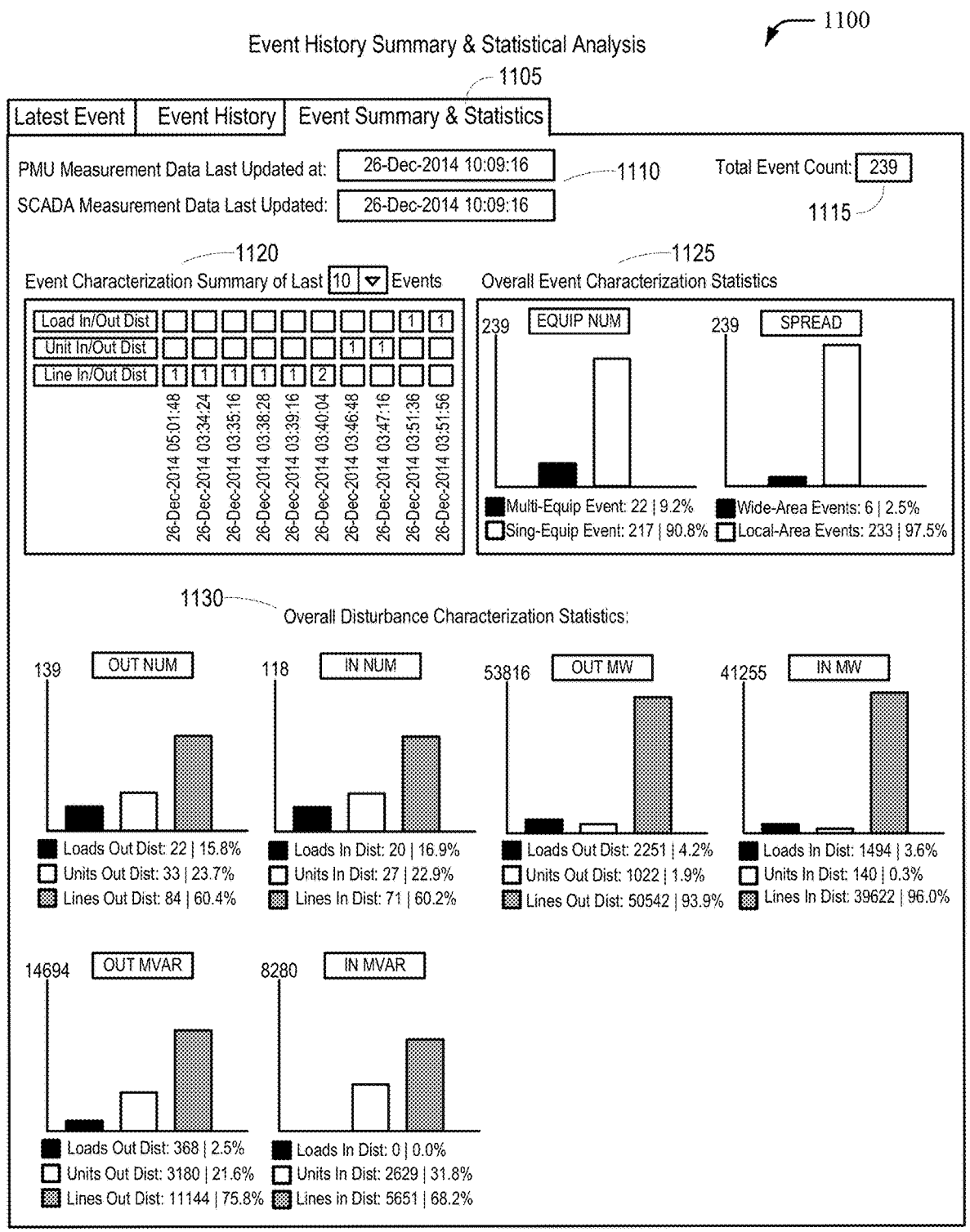

FIG. 11 illustrates an example of an event summary and statistics GUI 1100, which can provide a historical overview of event and disturbance characterization statistics. The event summary and statistics GUI 1100 can be presented when a user identity clicks on (or selects) the event summary and statistics tab 1105. event summary and statistics GUI 1100 can display a section showing the last time the data sources (e.g., PMU measurement data, SCADA measurement data) used by the EDM component 402 were updated 1110. The event summary and statistics GUI 1100 can display a total event count 1115 showing the total number of events that were detected by the EDM component 402. In the example shown in FIG. 11, the total event count 115 shows that 239 events were counted.

The event summary and statistics GUI 1100 can display an event characterization summary section 1120, which can display event characterization summary for the last N events, where N is some designated number (in the example shown in FIG. 11, N is 10). In example embodiments, as shown in FIG. 11, a user can select the number of events listed in the event characterization summary section 1120. In some example embodiments, a user can select a range of events (e.g., the last 10-20 events) to be displayed. The event characterization summary section can be arranged in an array in which each event can be listed, for example chronologically, by the time of the event (e.g., "26-Dec-2014 05:01:48, 26-Dec-2014 03:34:24, 26-Dec-2014 03:35:16, etc.). For each event, there can be an indication of the numerical number of each type of disturbance associated with that event. For example, referring to FIG. 10, for the event at the date and time 26-Dec-2014 05:01:48, a user identity can see that there were no "Load In/Out" disturbances associated with the event, no "Unit In/Out" disturbances associated with the event, and 1 "Line In/Out" disturbance associated with the event. As another example, the event of 26-Dec-2014 03:40:04 also had no "Load In/Out" and no "Unit In/Out" disturbances associated with the event, but did have 2 "Line In/Out" disturbances associated with the event. As another example, the event of 26-Dec-2014 03:46:48 had no Load In/Out disturbances and no Line In/Out disturbances, but did have 1 Unit In/Out disturbance associated with the event. As such, a user identity viewing the event summary section 1120 can see each event and the number and type of disturbance associated with the event.

Still referring to FIG. 11, the event summary and statistics GUI 1100 can also comprise an overall event characterization statistics section 1125. The overall event characterization statistics can illustrate graphics related to statistics in any number of ways, for example, a pie chart, or a bar graph. As shown in FIG. 11, for example, a bar graph is shown comprising various information comprising, for example, the total number of events (e.g., 239), a bar representing the number of events in which multiple equipment are impacted by the events, a numerical number of events in which multiple equipment are impacted (e.g., 22), and the percentage of events in which multiple equipment are impacted (e.g., 9.2%). The bar graph also shows a bar representing the number of events in which only a single piece of equipment is impacted by the events, a numerical number of events in which a single equipment is impacted (e.g., 217), and the percentage of events in which a single equipment is impacted (e.g., 90.8%). The overall event characterization statistics section 1125 can also comprise a second graph, which can be a bar graph, displaying various information related to the spread of the events. The second bar graph can comprise, for example, the total number of events (e.g., 239), a bar representing the number of wide-area events, a numerical number of wide-area events (e.g., 6), and the percentage of events that are wide-area events (e.g., 9.2%). The second bar graph can also comprise a bar representing the number of local-area events, a numerical number of local-area events (e.g., 233), and the percentage of events that are local-area events (e.g., 97.5%). These two bar graphs can provide a user identity viewing the graphs with some idea of the scope of the events in total.

Still referring to FIG. 11, the event summary and statistics GUI 1100 can comprise an overall disturbance characterization statistics section 1130, which can present information related to loads, units, and lines out/in in terms of numbers, power (MW), and reactive power (MVAR). The overall event characterization statistics can illustrate graphics related to statistics in any number of ways, for example, a pie chart, or a bar graph.

In example embodiments, the overall disturbance characterization statistics section 1130 can display an example first bar graph showing the total number of loads, units, and lines out (e.g., 139) disturbances. The first bar graph can display a bar representing the number of loads out disturbances, a numerical number of loads out disturbances, (e.g., 22), and a percentage (e.g., 15.8%) of the total that the number of loads out disturbances comprise. The first bar graph can also display a bar representing the number of units out disturbances, a numerical number of units out disturbances, (e.g., 33), and a percentage (e.g., 23.7%) of the total that the number of units out disturbances comprise. The first bar graph can also display a bar representing the number of lines out disturbances, a numerical number of lines out disturbances, (e.g., 84), and a percentage (e.g., 60.4%) of the total that the number of lines out disturbances comprise.

Still referring to FIG. 11, in example embodiments, the overall disturbance characterization statistics section 1130 can display an example second bar graph showing the total number of loads, units, and lines in disturbances (e.g., 118). The second bar graph can display a bar representing the number of loads in disturbances, a numerical number of loads in disturbances, (e.g., 20), and a percentage (e.g., 16.9%) of the total that the number of load out disturbances comprise. The second bar graph can also display a bar representing the number of units in disturbances, a numerical number of units in disturbances, (e.g., 27), and a percentage (e.g., 22.9%) of the total that the number of units in disturbances comprise. The second bar graph can also display a bar representing the number of lines in disturbances, a numerical number of lines in disturbances, (e.g., 71), and a percentage (e.g., 60.2%) of the total that the number of lines in disturbances comprise.

Still referring to FIG. 11, in example embodiments, the overall disturbance characterization statistics section 1130 can display an example third bar graph showing the total amount of power (in MW) impacted by loads, units, and lines out (e.g., 53816) disturbances. The third bar graph can display a bar representing the impacted power of loads out disturbances, a numerical amount of power corresponding to loads out disturbances, (e.g., 2251 MW), and a percentage (e.g., 4.2%) of the total amount of power impacted that loads out disturbances comprise. The third bar graph can also display a bar representing the impacted power of units out disturbances, a numerical amount of power corresponding to units out disturbances, (e.g., 1022 MW), and a percentage (e.g., 1.9%) of the total amount of power impacted that units out disturbances comprise. The third bar graph can also display a bar representing the impacted power of lines out disturbances, a numerical amount of power corresponding to lines out disturbances, (e.g., 50542 MW), and a percentage (e.g., 93.9%) of the total amount of power impacted that lines out disturbances comprise.

Still referring to FIG. 11, in example embodiments, the overall disturbance characterization statistics section 1130 can display an example fourth bar graph showing the total amount of power (in MW) impacted by loads, units, and lines in (e.g., 41255 MW) disturbances. The fourth bar graph can display a bar representing the impacted power of loads in disturbances, a numerical amount of power corresponding to loads in disturbances, (e.g., 1494 MW), and a percentage (e.g., 3.6%) of the total amount of power impacted that loads in disturbances comprise. The fourth bar graph can also display a bar representing the impacted power of units in disturbances, a numerical amount of power corresponding to units in disturbances, (e.g., 140 MW), and a percentage (e.g., 0.3%) of the total amount of power impacted that units in disturbances comprise. The fourth bar graph can also display a bar representing the impacted power of lines in disturbances, a numerical amount of power corresponding to lines in disturbances, (e.g., 39622 MW), and a percentage (e.g., 96.0%) of the total amount of power impacted that lines in disturbances comprise.

Still referring to FIG. 11, in example embodiments, the overall disturbance characterization statistics section 1130 can display an example fifth bar graph showing the total amount of reactive power (in MVAR) impacted by loads, units, and lines out (e.g., 14694) disturbances. The fifth bar graph can display a bar representing the impacted reactive power of loads out disturbances, a numerical amount of reactive power corresponding to loads out disturbances, (e.g., 368 MVAR), and a percentage (e.g., 2.5%) of the total amount of reactive power impacted that loads out disturbances comprise. The fifth bar graph can also display a bar representing the impacted reactive power of units out disturbances, a numerical amount of reactive power corresponding to units out disturbances, (e.g., 3180 MVAR), and a percentage (e.g., 21.6%) of the total amount of reactive power impacted that units out disturbances comprise. The fifth bar graph can also display a bar representing the impacted reactive power of lines out disturbances, a numerical amount of reactive power corresponding to lines out disturbances, (e.g., 11144 MVAR), and a percentage (e.g., 75.8%) of the total amount of reactive power impacted that lines out disturbances comprise.

Still referring to FIG. 11, in example embodiments, the overall disturbance characterization statistics section 1130 can display an example sixth bar graph showing the total amount of reactive power (in MVAR) impacted by loads, units, and lines in (e.g., 8280 MVAR) disturbances. The sixth bar graph can display a bar representing the impacted reactive power of loads in disturbances, a numerical amount of power corresponding to loads in disturbances, (e.g., 0 MVAR), and a percentage (e.g., 0%) of the total amount of reactive power impacted that loads in disturbances comprise. The sixth bar graph can also display a bar representing the impacted reactive power of units in disturbances, a numerical amount of reactive power corresponding to units in disturbances, (e.g., 2629 MVAR), and a percentage (e.g., 31.8%) of the total amount of reactive power impacted that units in disturbances comprise. The sixth bar graph can also display a bar representing the impacted reactive power of lines in disturbances, a numerical amount of reactive power corresponding to lines in disturbances, (e.g., 5651 MW), and a percentage (e.g., 68.2%) of the total amount of power impacted that lines out disturbances comprise.

Figure 12:
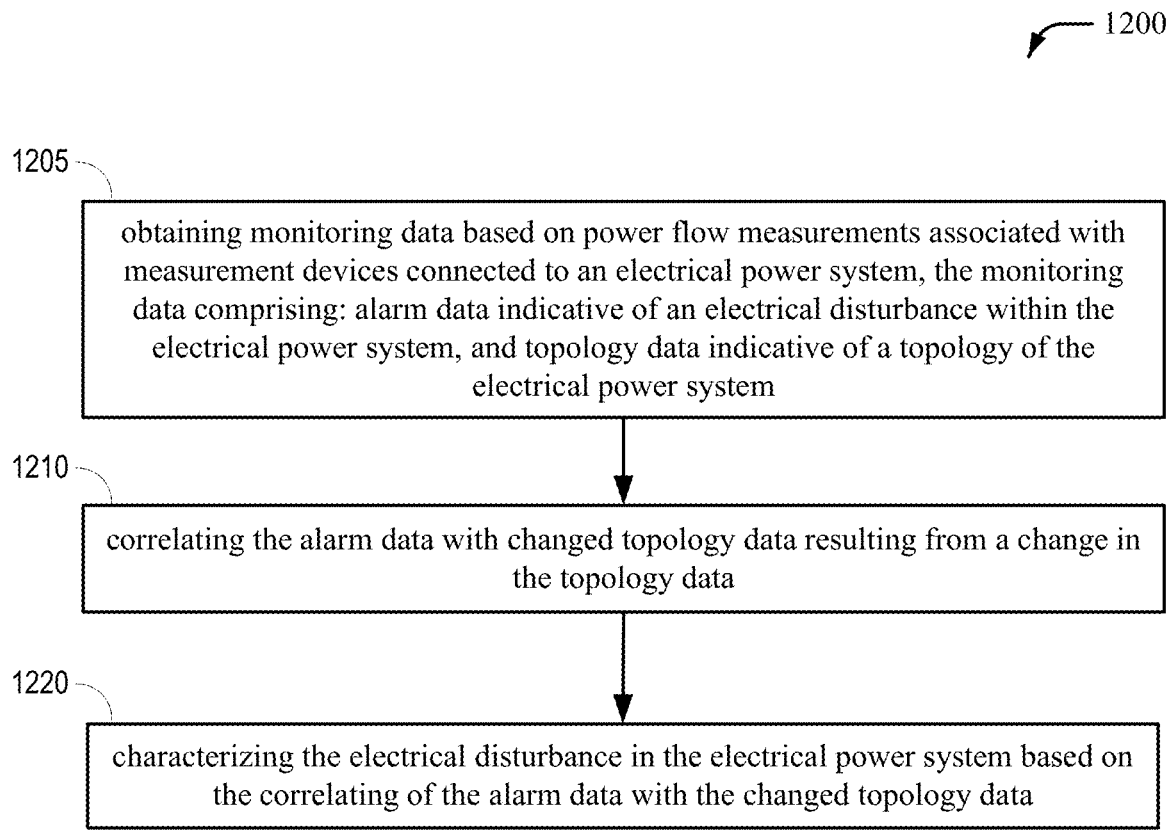
FIG. 12 illustrates an example device operable to perform enhanced disturbance management operations in accordance with aspects of the subject disclosure.
Figure 14:
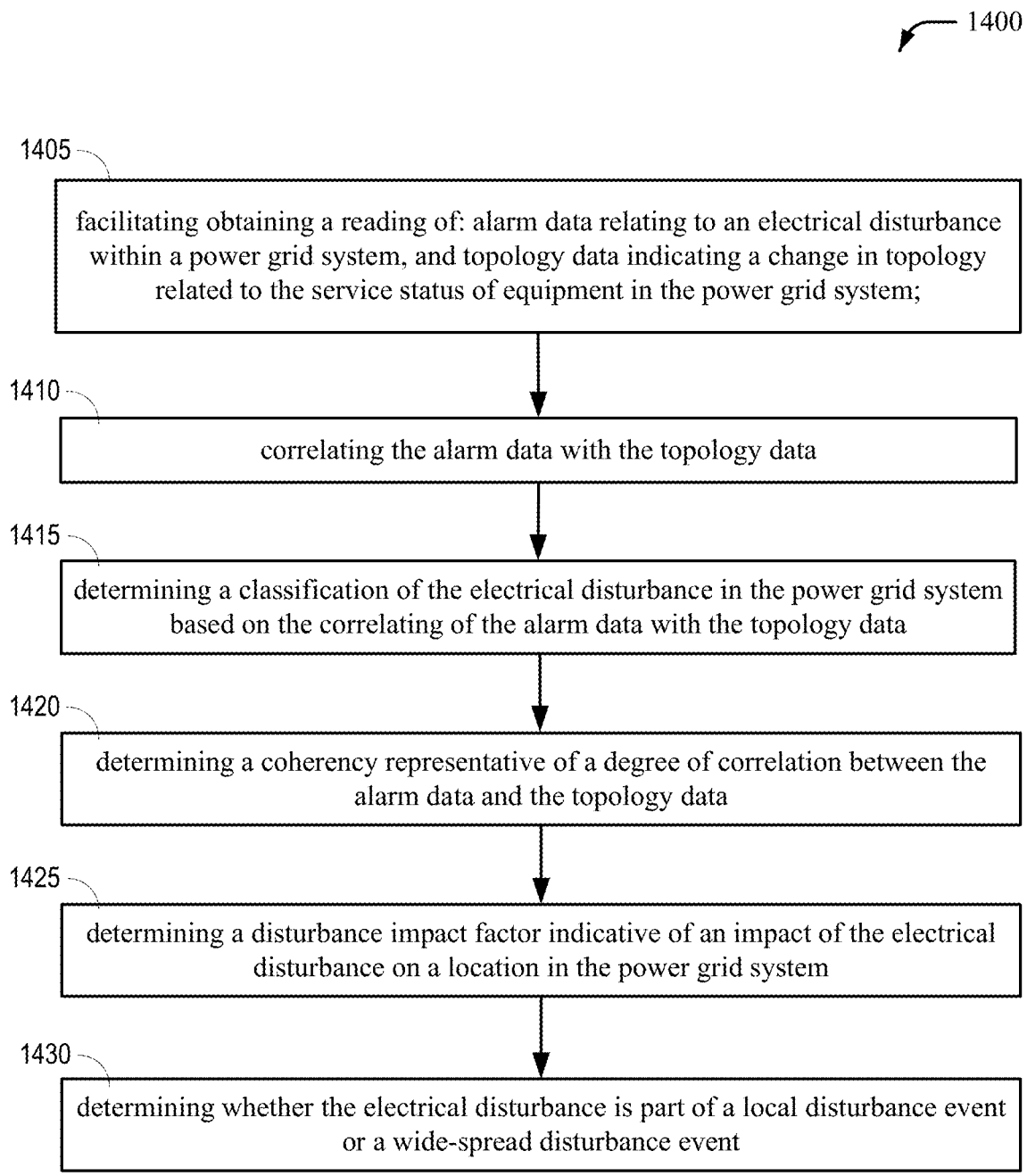
FIG. 14 illustrates a machine-readable storage medium comprising executable instructions that, in response to execution, cause a device comprising a processor to perform operations performing enhanced disturbance management in a power grid system in accordance with aspects of the subject disclosure.

In view of the example system(s) described above, example method(s) that can be implemented in accordance with the disclosed subject matter can be better appreciated with reference to flowcharts in FIGS. 12-14. For purposes of simplicity of explanation, example methods disclosed herein are presented and described as a series of acts; however, it is to be understood and appreciated that the claimed subject matter is not limited by the order of acts, as some acts may occur in different orders or concurrently with other acts from that shown and described herein. For example, one or more example methods disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a described example method in accordance with the subject specification. Further yet, two or more of the disclosed example methods can be implemented in combination with each other, to accomplish one or more aspects herein described. It should be further appreciated that the example methods disclosed throughout the subject specification are capable of being stored on an article of manufacture (e.g., a computer-readable medium) to allow transporting and transferring such methods to computers for execution, and thus implementation, by a processor or for storage in a memory.

Referring to FIG. 12, in non-limiting embodiments (also referred to as example embodiments), a device, comprising a processor and a memory that stores executable instructions (e.g., stored on a machine-readable storage medium), that can, when executed by the processor, facilitate performance of operations (e.g., perform a method), or cause a device comprising a processor to perform operations. The device can be, for example, a computing device comprising EDM component 402.

At step 1205, the operations can comprise obtaining monitoring data based on power flow measurements associated with measurement devices connected to an electrical power system. The monitoring data can comprise alarm data indicative of an electrical disturbance within the electrical power system, and can also comprise topology data indicative of a topology of the electrical power system. The measurement devices can comprise a phasor measurement unit device that monitors electrical parameters associated with the electrical power system. The alarm data can relate to an angle disturbance alarm generated in response to a detection by the phasor measurement unit device of a difference in phase angle of a voltage associated with the electrical power system, and more specifically, with different nodes in an electrical power system. The alarm data can also relate to a frequency disturbance alarm generated in response to a detection by the phasor measurement unit device of a frequency disturbance associated with the electrical power system, or a difference in frequency associated with the electrical power system. The alarm data can also relate to an oscillation disturbance alarm generated in response to a detection of an oscillation disturbance associated with the electrical power system. The alarm data can also relate to any other electrical parameter that can be measured by, for example, a phasor measurement unit. The power flow measurements can be repeatedly obtained from the electrical power system. The topology data can comprise an energization status of equipment in the electrical power system. The energization status can relate to the equipment being taken out of service from the electrical power system. The energization status can also relate to the equipment being placed into service in the electrical power system. The electrical disturbance can be one of a group of disturbances comprising a disturbance event, and the operations can further comprise, determining whether the disturbance event is a local disturbance event in which only one location is impacted by the disturbance event, or a wide-spread disturbance event in which several locations are impacted by the disturbance event. The operations can comprise determining a disturbance magnitude for each electrical disturbance, wherein the disturbance magnitude can comprise information about a change in electrical parameters (e.g. change in real power, change in reactive power, and change in voltage) at the point of each electrical disturbance, during the transition from pre-disturbance state to post-disturbance state. The disturbance magnitude information can be for the disturbance epicenter, for example. The disturbance magnitude information can also be for the most impacted PMU location, for example.

At step 1210, the operations can comprise correlating the alarm data with changed topology data resulting from a change in the topology data.

At step 1220, the operations can comprise characterizing the electrical disturbance in the electrical power system based on the correlating of the alarm data with the changed topology data.

Still referring to FIG. 12, in example embodiments, the operations can further comprise determining a coherency level representative of a degree of correlation between the alarm data and the changed topology data. The operations further comprise determining a disturbance impact factor indicative of an impact of the electrical disturbance at a location associated with the measurement devices. An electric substation, positioned at the location, converts a voltage of electric energy associated with the electrical power system from a first level of voltage to a second level of voltage.

Referring to FIG. 13, in non-limiting embodiments (also referred to as example embodiments), a device, comprising a processor and a memory that stores executable instructions (e.g., stored on a machine-readable storage medium), that can, when executed by the processor, facilitate performance of operations (e.g., perform a method), or cause a device comprising a processor to perform a method. The device can be, for example, a computing device comprising EDM component 402.

At step 1305, the method can comprise receiving, by a device comprising a processor and memory, measurement data associated with measurement devices connected to an electrical power system. The measurement data can comprise alarm data indicative of an electrical disturbance within the electrical power system, and the measurement data can also comprise topology data indicative of a change in a topology related to an arrangement of equipment in the electrical power system and a power status of the equipment.

At step 1310, the method can comprise correlating, by the device, the alarm data with the change in the topology.

At step 1315, the method can comprise determining, by the device, a causation of the electrical disturbance in the electrical power system based on the correlating of the alarm data with the change in the topology.

At step 1320, the method can comprise determining, by the device, a coherency indicator representative of the level of correlation between the alarm data and the change in topology.

At step 1325, the method can comprise determining, by the device, a disturbance impact factor reflective of an impact of the electrical disturbance on a location.

Still referring to FIG. 13, the measurement devices can comprise a phasor measurement unit device that monitors electrical parameters associated with the electrical power system. The measurement devices can also comprise a voltage sensor that measures a voltage associated with the equipment. The measurement devices can also comprise a current sensor that measures a current associated with the equipment. The alarm data can relate to an angle disturbance alarm generated in response to a detection by the phasor measurement unit device of a difference in phase angle of a voltage associated with the electrical power system, and more specifically, with different nodes in an electrical power system. The alarm data can also relate to a frequency disturbance alarm generated in response to a detection by the phasor measurement unit device of a frequency disturbance associated with the electrical power system, or a difference in frequency associated with the electrical power system. Still yet, the alarm data can relate to an oscillation disturbance alarm generated in response to a detection of an oscillation disturbance associated with the electrical power system. The alarm data can also relate to any electrical parameter that can be measured by, for example, a phasor measurement unit.

Still referring to FIG. 13, the method can comprise, generating, by the device, a notification comprising modifying a portion of a graphical user interface displaying, for the electrical disturbance: the causation, the location, the coherency indicator, the disturbance impact factor, and an identification of the phasor measurement unit device associated with the electrical disturbance. The causation comprises at least one of a line out disturbance in which a line is out of service from the electrical power system, a unit out disturbance in which a power generating unit is out of service from the electrical power system, or a load out disturbance in which a load has been disconnected from the electrical power system. Example embodiments of the information displayed can be as shown in FIGS. 7-11.

Referring to FIG. 14, in non-limiting embodiments (also referred to as example embodiments), a device, comprising a processor and a memory that stores executable instructions (e.g., stored on a machine-readable storage medium), that can, when executed by the processor, facilitate performance of operations (e.g., perform a method), or cause a device comprising a processor to perform a method. The device can be, for example, a computing device comprising EDM component 402.

At step 1405, the operations can comprise facilitating obtaining a reading of alarm data relating to an electrical disturbance within a power grid system, and obtaining a reading of topology data indicating a change in topology related to the service status of equipment in the power grid system. The alarm data and the topology data can be data that is associated with measurement data derived from measurement devices in the power grid system. The measurement devices can comprise a phasor measurement unit device that monitors electrical parameters associated with the power grid system. The alarm data can relate to any electrical parameter that can be measured by, for example, a phasor measurement unit. The alarm data can relate to an angle disturbance alarm generated in response to a detection by the phasor measurement unit device of a difference in phase angle of a voltage associated with the electrical power system, and more specifically, with different nodes in an electrical power system. The alarm data can also relate to a frequency disturbance alarm generated in response to a detection by the phasor measurement unit device of a frequency disturbance associated with the electrical power system, or a difference in frequency associated with the electrical power system. Still yet, the alarm data can relate to an oscillation disturbance alarm generated in response to a detection by the phasor measurement unit device of an oscillation disturbance associated with the electrical power system.

At step 1410, the operations can comprise correlating the alarm data with the topology data.

At step 1415, the operations can comprise determining a classification of the electrical disturbance in the power grid system based on the correlating of the alarm data with the topology data.

At step 1420, the operations can comprise determining a coherency representative of a degree of correlation between the alarm data and the topology data. As examples, the coherency can be high or low coherence for frequency disturbance, and high and low coherency for angle disturbance.

At step 1425, the operations can also comprise determining a disturbance impact factor indicative of an impact of the electrical disturbance on a location in the power grid system. The disturbance impact factor can be derived as described above with respect to FIG. 5.

At step 1430, the operations can also comprise determining whether the electrical disturbance is part of a local disturbance event or a wide-spread disturbance event. As an example, a local disturbance event is one in which only one location is impacted, while a wide-spread disturbance event can be one in which multiple locations are impacted.

Still referring to FIG. 14, the operations can further comprise, generating a notification comprising modifying a portion of a displayed summary of a defined number of previous disturbance events, wherein the summary comprises an indicator of a time of occurrence of each event of the defined number of previous disturbance events, and a numerical count of the classification of each electrical disturbance comprising each disturbance event of the defined number of previous disturbance events. As mentioned above, other displayed information can comprise information regarding the latest event, event history, event summary and statistics, and other relevant information (see, e.g., FIGS. 7-11).

Figure 15:
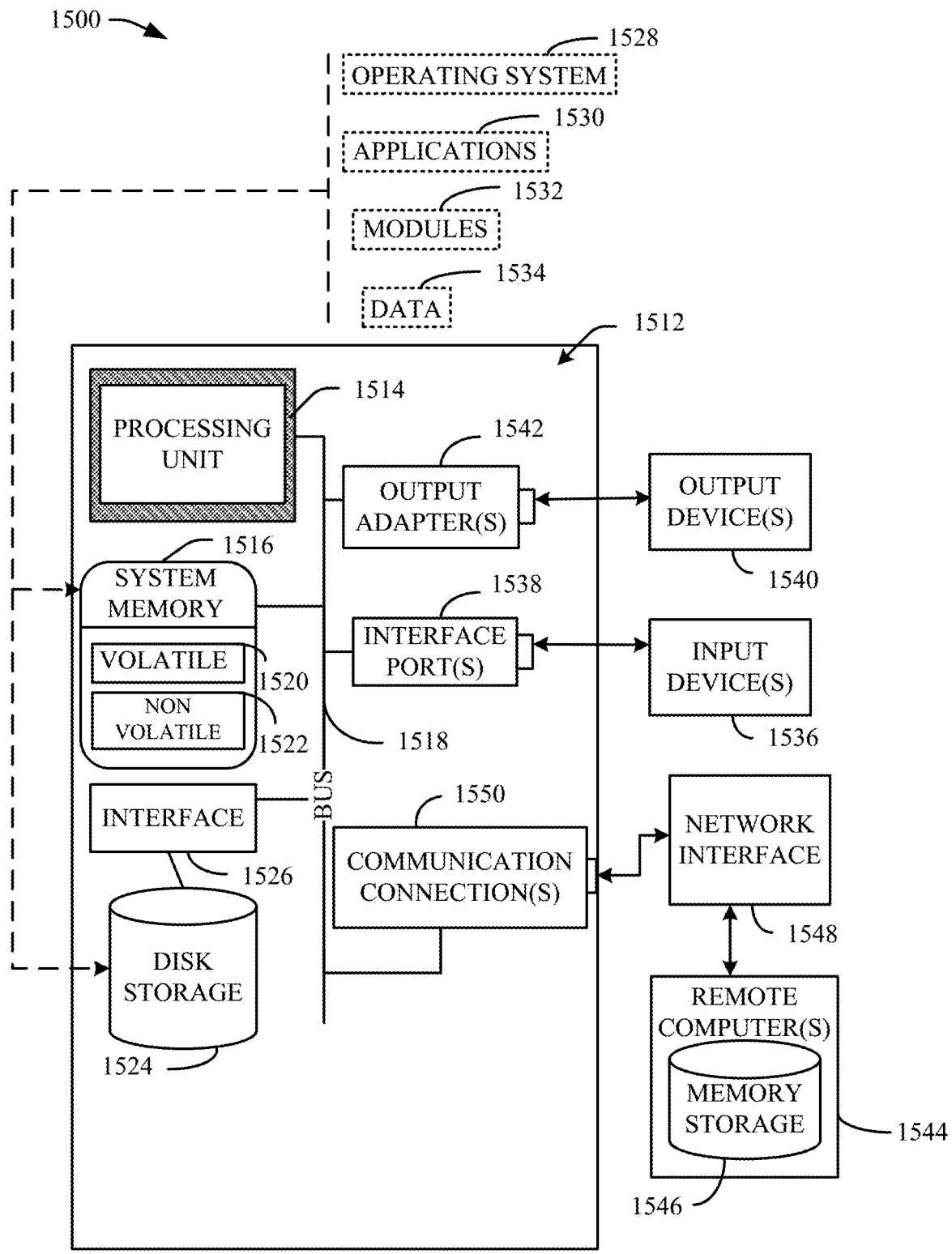
FIG. 15 is a schematic block diagram of a sample-computing environment.

To provide a context for the various aspects of the disclosed subject matter, FIG. 15, and the following discussion, are intended to provide a brief, general description of a suitable environment in which the various aspects of the disclosed subject matter can be implemented. While the subject matter has been described above in the general context of computer-executable instructions of a computer program that runs on a computer or computers, those skilled in the art will recognize that the disclosed subject matter also can be implemented in combination with other program modules. Generally, program modules comprise routines, programs, components, data structures, etc. that performs particular tasks or implement particular abstract data types.

In the subject specification, terms such as "store," "storage," "data store," "data storage," "database," and substantially any other information storage component relevant to operation and functionality of a component, refer to "memory components," or entities embodied in a "memory" or components comprising the memory. It is noted that the memory components described herein can be either volatile memory or nonvolatile memory, or can comprise both volatile and nonvolatile memory, by way of illustration, and not limitation, volatile memory 1520 (see below), nonvolatile memory 1522 (see below), disk storage 1524 (see below), and memory storage 1546 (see below). Further, nonvolatile memory can comprise read only memory, programmable read only memory, electrically programmable read only memory, electrically erasable read only memory, flash memory, or solid state memory (e.g., solid state drive). Volatile memory can comprise random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to comprise, without being limited to comprising, these and any other suitable types of memory.

Moreover, it is noted that the disclosed subject matter can be practiced with other computer system configurations, including single-processor or multiprocessor computer systems, mini-computing devices, mainframe computers, as well as personal computers, hand-held computing devices (e.g., personal digital assistant, phone, watch, tablet computers, netbook computers, . . . ), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

FIG. 15 illustrates a block diagram of a computing system 1500 operable to execute the disclosed systems and methods in accordance with example embodiments of the present application. Computer 1512 can comprise a processing unit 1514, a system memory 1516, and a system bus 1518. System bus 1518 couples system components including, but not limited to, system memory 1516 to processing unit 1514. Processing unit 1514 can be any of various available processors. Dual microprocessors and other multiprocessor architectures also can be employed as processing unit 1514.

System bus 1518 can be any of several types of bus structure(s) including a memory bus or a memory controller, a peripheral bus or an external bus, or a local bus using any variety of available bus architectures including, but not limited to, industrial standard architecture, micro-channel architecture, extended industrial standard architecture, intelligent drive electronics, video electronics standards association local bus, peripheral component interconnect, card bus, universal serial bus, advanced graphics port, personal computer memory card international association bus, Firewire (Institute of Electrical and Electronics Engineers 1394), and small computer systems interface.

System memory 1516 can comprise volatile memory 1520 and nonvolatile memory 1522. A basic input/output system, containing routines to transfer information between elements within computer 1512, such as during start-up, can be stored in nonvolatile memory 1522. By way of illustration, and not limitation, nonvolatile memory 1522 can comprise read only memory, programmable read only memory, electrically programmable read only memory, electrically erasable read only memory, or flash memory. Volatile memory 1520 can comprise read only memory, which acts as external cache memory. By way of illustration and not limitation, read only memory is available in many forms such as synchronous random access memory, dynamic read only memory, synchronous dynamic read only memory, double data rate synchronous dynamic read only memory, enhanced synchronous dynamic read only memory, Synchlink dynamic read only memory, Rambus direct read only memory, direct Rambus dynamic read only memory, and Rambus dynamic read only memory.

Computer 1512 can also comprise removable/non-removable, volatile/non-volatile computer storage media. FIG. 15 illustrates, for example, disk storage 1524. Disk storage 1524 can comprise devices like a magnetic disk drive, floppy disk drive, tape drive, flash memory card, or memory stick. In addition, disk storage 1524 can comprise storage media separately or in combination with other storage media including, but not limited to, an optical disk drive such as a compact disk read only memory device, compact disk recordable drive, compact disk rewritable drive or a digital versatile disk read only memory. To facilitate connection of the disk storage devices 1524 to system bus 1518, a removable or non-removable interface is typically used, such as interface 1526.

Computing devices typically comprise a variety of media, which can comprise computer-readable storage media or communications media, which two terms are used herein differently from one another as follows.

Computer-readable storage media can be any available storage media that can be accessed by the computer and can comprise both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can comprise, but are not limited to, read only memory, programmable read only memory, electrically programmable read only memory, electrically erasable read only memory, flash memory or other memory technology, compact disk read only memory, digital versatile disk or other optical disk storage, magnetic cassettes, magnetic tape, magnetic disk storage or other magnetic storage devices, or other tangible media which can be used to store desired information. In this regard, the term "tangible" herein as may be applied to storage, memory or computer-readable media, is to be understood to exclude only propagating intangible signals per se as a modifier and does not relinquish coverage of all standard storage, memory or computer-readable media that are not only propagating intangible signals per se. In an aspect, tangible media can comprise non-transitory media wherein the term "non-transitory" herein as may be applied to storage, memory or computer-readable media, is to be understood to exclude only propagating transitory signals per se as a modifier and does not relinquish coverage of all standard storage, memory or computer-readable media that are not only propagating transitory signals per se. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and can comprise any information delivery or transport media. The term "modulated data signal" or signals refers to a signal that has one or more of its characteristics set or changed in such a manner as to encode information in one or more signals. By way of example, and not limitation, communication media can comprise wired media, such as a wired network or direct-wired connection, and wireless media such as acoustic, RF, infrared and other wireless media.

It can be noted that FIG. 15 describes software that acts as an intermediary between users and computer resources described in suitable operating environment 1500. Such software can comprise an operating system 1528. Operating system 1528, which can be stored on disk storage 1524, acts to control and allocate resources of computer system 1512. System applications 1530 take advantage of the management of resources by operating system 1528 through program modules 1532 and program data 1534 stored either in system memory 1516 or on disk storage 1524. It is to be noted that the disclosed subject matter can be implemented with various operating systems or combinations of operating systems.

A user can enter commands or information into computer 1512 through input device(s) 1536. As an example, a user interface can be embodied in a touch sensitive display panel allowing a user to interact with computer 1512. Input devices 1536 can comprise a pointing device such as a mouse, trackball, stylus, touch pad, keyboard, microphone, joystick, game pad, satellite dish, scanner, TV tuner card, digital camera, digital video camera, web camera, cell phone, smartphone, tablet computer, etc. These and other input devices connect to processing unit 1514 through system bus 1518 by way of interface port(s) 1538. Interface port(s) 1538 comprise, for example, a serial port, a parallel port, a game port, a universal serial bus, an infrared port, a Bluetooth port, an IP port, or a logical port associated with a wireless service, etc. Output device(s) 1540 use some of the same type of ports as input device(s) 1536.

Thus, for example, a universal serial busport can be used to provide input to computer 1512 and to output information from computer 1512 to an output device 1540. Output adapter 1542 is provided to illustrate that there are some output devices 1540 like monitors, speakers, and printers, among other output devices 1540, which use special adapters. Output adapters 1542 comprise, by way of illustration and not limitation, video and sound cards that provide means of connection between output device 1540 and system bus 1518. It should be noted that other devices or systems of devices provide both input and output capabilities such as remote computer(s) 1544.

Computer 1512 can operate in a networked environment using logical connections to one or more remote computers, such as remote computer(s) 1544. Remote computer(s) 1544 can be a personal computer, a server, a router, a network PC, cloud storage, cloud service, a workstation, a microprocessor based appliance, a peer device, or other common network node and the like, and typically can comprise many or all of the elements described relative to computer 1512.

For purposes of brevity, only a memory storage device 1546 is illustrated with remote computer(s) 1544. Remote computer(s) 1544 is logically connected to computer 1512 through a network interface 1548 and then physically connected by way of communication connection 1550. Network interface 1548 encompasses wire or wireless communication networks such as local area networks and wide area networks. Local area network technologies can comprise fiber distributed data interface, copper distributed data interface, Ethernet, Token Ring and the like. Wide area network technologies can comprise point-to-point links, circuit-switching networks like integrated services digital networks and variations thereon, packet switching networks, and digital subscriber lines. As noted below, wireless technologies may be used in addition to or in place of the foregoing.

Communication connection(s) 1550 refer(s) to hardware/software employed to connect network interface 1548 to bus 1518. While communication connection 1550 is shown for illustrative clarity inside computer 1512, it can also be external to computer 1512. The hardware/software for connection to network interface 1548 can comprise, for example, internal and external technologies such as modems, including regular telephone grade modems, cable modems and digital subscriber line modems, integrated services digital network adapters, and Ethernet cards.

Figure 16:
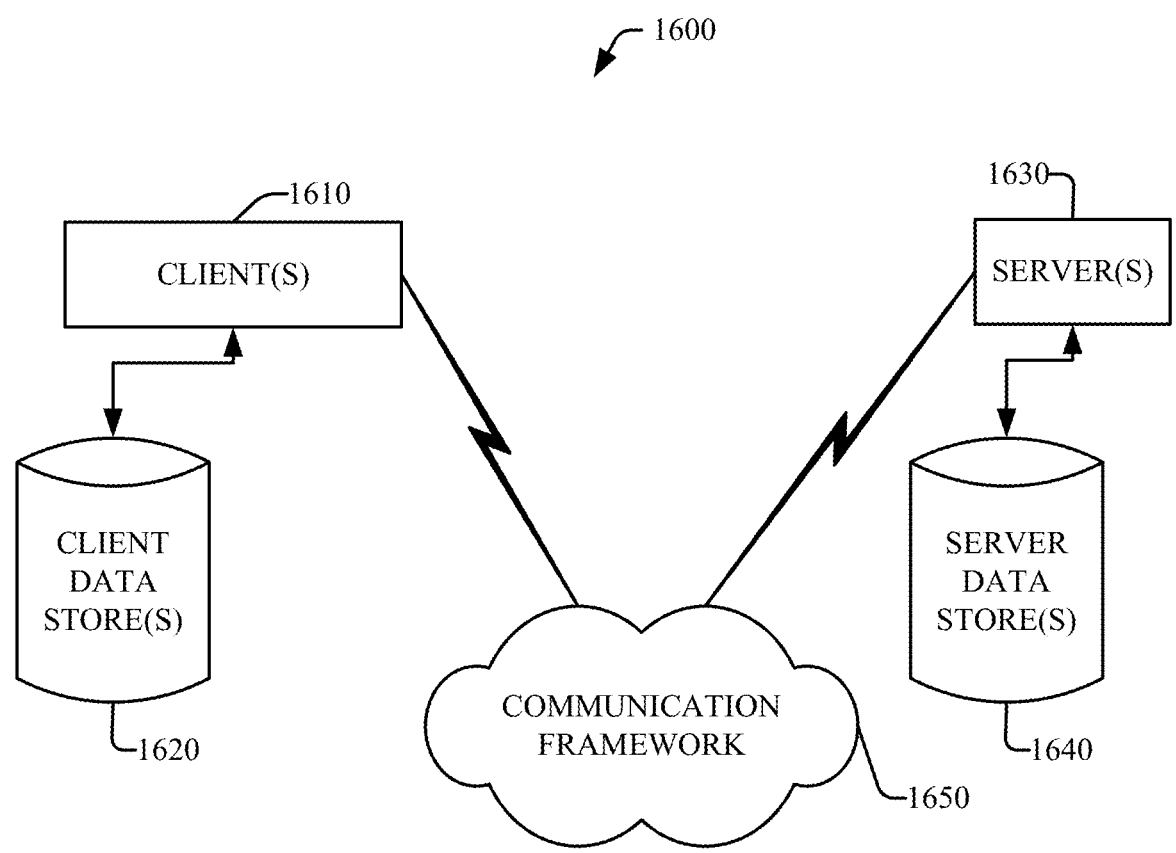
FIG. 16 depicts a diagram of an example client-server network environment in which various aspects of the disclosed subject matter can be practiced.

FIG. 16 is a schematic block diagram of a sample-computing environment 1600 with which the subject matter of this disclosure can interact. The system 1600 can comprise one or more client(s) 1610. The client(s) 1610 can be hardware or software (e.g., threads, processes, computing devices). The system 1600 also can comprise one or more server(s) 1630. Thus, system 1600 can correspond to a two-tier client server model or a multi-tier model (e.g., client, middle tier server, data server), amongst other models. The server(s) 1630 can also be hardware or software (e.g., threads, processes, computing devices). The servers 1630 can house threads to perform transformations by employing this disclosure, for example. One possible communication between a client 1610 and a server 1630 may be in the form of a data packet transmitted between two or more computer processes.

The system 1600 can comprise a communication framework 1650 that can be employed to facilitate communications between the client(s) 1610 and the server(s) 1630. The client(s) 1610 are operatively connected to one or more client data store(s) 1620 that can be employed to store information local to the client(s) 1610. Similarly, the server(s) 1630 are operatively connected to one or more server data store(s) 1640 that can be employed to store information local to the servers 1630.

It is to be noted that aspects or features of this disclosure can be exploited in substantially any wireless telecommunication or radio technology, e.g., Wi-Fi; Bluetooth; Worldwide Interoperability for Microwave Access (WiMAX); Enhanced General Packet Radio Service (Enhanced GPRS); Third Generation Partnership Project (3GPP) Long Term Evolution (LTE); Third Generation Partnership Project 2 (3GPP2) Ultra Mobile Broadband (UMB); 3GPP Universal Mobile Telecommunication System (UMTS); High Speed Packet Access (HSPA); High Speed Downlink Packet Access (HSDPA); High Speed Uplink Packet Access (HSUPA); GSM (Global System for Mobile Communications) EDGE (Enhanced Data Rates for GSM Evolution) Radio Access Network (GERAN); UMTS Terrestrial Radio Access Network (UTRAN); LTE Advanced (LTE-A); etc. Additionally, some or all of the aspects described herein can be exploited in legacy telecommunication technologies, e.g., GSM. In addition, mobile as well non-mobile networks (e.g., the Internet, data service network such as internet protocol television (IPTV), etc.) can exploit aspects or features described herein.

While the subject matter has been described above in the general context of computer-executable instructions of a computer program that runs on a computer or computers, those skilled in the art will recognize that this disclosure also can or may be implemented in combination with other program modules. Generally, program modules can comprise routines, programs, components, data structures, etc. that perform particular tasks or implement particular abstract data types. Moreover, those skilled in the art will appreciate that the inventive methods may be practiced with other computer system configurations, including single-processor or multiprocessor computer systems, mini-computing devices, mainframe computers, as well as personal computers, hand-held computing devices (e.g., PDA, phone), microprocessor-based or programmable consumer or industrial electronics, and the like. The illustrated aspects may also be practiced in distributed computing environments where tasks are performed by remote processing devices that are linked through a communications network. However, some, if not all aspects of this disclosure can be practiced on stand-alone computers. In a distributed computing environment, program modules may be located in both local and remote memory storage devices.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, or a computer. By way of illustration and not limitation, both an application running on a server and the server can be a component. One or more components may reside within a process or thread of execution and a component may be localized on one computer or distributed between two or more computers. In addition, these components can execute from various computer readable media having various data structures stored thereon. The components may communicate via local or remote processes such as in accordance with a signal having one or more data packets (e.g., data from one component interacting with another component in a local system, distributed system, or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A, X employs B, or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

Further, the term "include" is intended to be employed as an open or inclusive term (e.g., including, but not limited to), rather than a closed or exclusive term. The term "include" can be substituted with the term "comprise" and is to be treated with similar scope, unless otherwise explicitly used otherwise. As an example, "a basket of fruit including an apple" is to be treated with the same breadth of scope as, "a basket of fruit comprising an apple."

Furthermore, the terms "user," "subscriber," "customer," "operator," "switchman," "consumer," "prosumer," "agent," and the like are employed interchangeably throughout the subject specification, unless context warrants particular distinction(s) among the terms. It should be appreciated that such terms can refer to human entities or automated components (e.g., supported through artificial intelligence, as through a capacity to make inferences based on complex mathematical formalisms), that can provide simulated vision, sound recognition and so forth.

What has been described above can comprise examples of systems and methods illustrative of the disclosed subject matter. It is, of course, not possible to describe every combination of components or methods herein. One of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A device, comprising:
a processor; and
a memory that stores executable instructions that, when executed by the processor, facilitate performance of operations, comprising:

obtaining monitoring data based on power flow measurements associated with measurement devices connected to an electrical power system, the monitoring data comprising: alarm data indicative of an electrical disturbance within the electrical power system, and topology data indicative of a topology of the electrical power system wherein the topology data includes an energization status and a connection status of components of the electrical power system;

monitoring the energization status and the connection status of the components;

based upon the monitoring, determining changed topology data from the topology data, the changed topology data indicating that a change in the topology of the electrical power system has occurred;

correlating the alarm data with the changed topology data, wherein the correlating matches at least one alarm indicated by the alarm data to the change in topology indicated by the changed topology data; and characterizing the electrical disturbance in the electrical power system based on the correlating of the alarm data with the changed topology data;

wherein the operations further comprise determining a coherency level representative of a degree of correlation between a specific alarm present in the alarm data and the changed topology data, the correlation level indicating a likelihood that the specific alarm was caused by the change in topology;

wherein the operations further comprise determining a disturbance impact factor indicative of an impact of the electrical disturbance at locations associated with the measurement devices, the locations including a disturbance epicenter and other locations impacted by the disturbance.

2. The device of claim 1, wherein the measurement devices comprise a phasor measurement unit device that monitors electrical parameters associated with the electrical power system.

3. The device of claim 2, wherein the alarm data relates to an angle disturbance alarm generated in response to a detection by the phasor measurement unit device of a difference in phase angle of a voltage associated with different nodes in the electrical power system.

4. The device of claim 2, wherein the alarm data relates to a frequency disturbance alarm generated in response to a detection by the phasor measurement unit device of a frequency disturbance associated with the electrical power system.

5. The device of claim 2, wherein the alarm data relates to an oscillation disturbance alarm generated in response to a detection by the phasor measurement unit device of an oscillation disturbance associated with the electrical power system.

6. The device of claim 1, wherein the energization status relates to the equipment being taken out of service from the electrical power system.

7. The device of claim 1, wherein the energization status relates to the equipment being placed into service in the electrical power system.

8. The device of claim 1, wherein the electrical disturbance is one of a group of disturbances comprising a disturbance event, and wherein the operations further comprise, determining whether the disturbance event is a local disturbance event in which only one location is impacted by the disturbance event, or a wide-spread disturbance event in which several locations are impacted by the disturbance event.

9. A method, comprising:

receiving, by a device comprising a processor and memory, measurement data associated with measurement devices connected to an electrical power system, wherein the measurement data comprises: alarm data indicative of an electrical disturbance within the electrical power system, and topology data indicative of a topology of the electrical power, wherein the topology data includes an energization status and a connection status of components of the electrical power system;

monitoring the energization status and the connection status of the components;

based upon the monitoring, determining changed topology data from the topology data, the changed topology data indicating that a change in the topology of the electrical power system has occurred, wherein the change in topology is related to a change in an arrangement of equipment in the electrical power system and a power status of the equipment;

correlating, by the device, the alarm data with the changed topology data, wherein the correlating matches at least one alarm indicated by the alarm data to the change in topology indicated by the changed topology data;

determining, by the device, a causation of the electrical disturbance in the electrical power system based on the correlating;

determining, by the device, a coherency indicator representative of the level of correlation between a specific alarm present in the alarm data and the change in topology, the coherency indicator indicating a likelihood that the specific alarm was caused by the change in topology; and determining, by the device, a disturbance impact factor reflective of an impact of the electrical disturbance on locations, the locations including a disturbance epicenter and other locations impacted by the disturbance.

10. The method of claim 9, wherein the measurement devices comprise:

a phasor measurement unit device that monitors electrical parameters associated with the electrical power system;

a voltage sensor that measures a voltage associated with the equipment; and a current sensor that measures a current associated with the equipment.

11. The method of claim 10, wherein an angle disturbance alarm is generated in response to a detection by the phasor measurement unit device of a difference in voltage phase angle associated with the electrical power system being detected.

12. The method of claim 10, wherein a frequency disturbance alarm is generated in response to a detection by the phasor measurement unit device of a difference in frequency associated with the electrical power system being detected.

13. The method of claim 10, further comprising, generating, by the device, a notification comprising modifying a portion of a graphical user interface displaying, for the electrical disturbance:

the causation, the location, the coherency indicator, the disturbance impact factor, and an identification of the phasor measurement unit device associated with the electrical disturbance.

14. The method of claim 13, wherein the causation comprises at least one of a line out disturbance in which a line is out of service from the electrical power system, a unit out disturbance in which a power generating unit is out of service from the electrical power system, or a load out disturbance in which a load has been disconnected from the electrical power system.

15. A non-transitory machine-readable storage medium comprising executable instructions that, in response to execution, cause a device comprising a processor to perform operations, comprising:

facilitating obtaining a reading of: alarm data relating to an electrical disturbance within a power grid system, and topology data indicative of a topology of the electrical power system wherein the topology data includes an energization status and a connection status of components of the electrical power system;

monitoring the energization status and the connection status of the components;

based upon the monitoring, determining changed topology data from the topology data, the changed topology data indicating that a change in the topology of the electrical power system has occurred, wherein the change in topology is related to a change in an arrangement of equipment in the electrical power system and a power status of the equipment;

correlating the alarm data with the changed topology data, wherein the correlating matches at least one alarm indicated by the alarm data to the change in topology indicated by the changed topology data;

determining a classification of the electrical disturbance in the power grid system based on the correlating;

determining a coherency representative of a degree of correlation between a specific alarm present in the alarm data and the change in topology, the coherency indicating a likelihood that the specific alarm was caused by the change in topology;

determining a disturbance impact factor indicative of an impact of the electrical disturbance on locations in the power grid system, the locations including a disturbance epicenter and other locations impacted by the disturbance; and determining whether the electrical disturbance is part of a local disturbance event or a wide-spread disturbance event.

16. The non-transitory machine-readable storage medium of claim 15, wherein the alarm data and the topology data are associated with measurement data derived from measurement devices in the power grid system.

17. The non-transitory machine-readable storage medium of claim 16, wherein the measurement devices comprise a phasor measurement unit device that monitors electrical parameters associated with the power grid system, and wherein the alarm data relates to an angle disturbance alarm generated in response to a detection by the phasor measurement unit device of a difference in a phase angle of a voltage associated with the power grid system.

18. The non-transitory machine-readable storage medium of claim 16, wherein the measurement devices comprise a phasor measurement unit device that monitors electrical parameters associated with the power grid system, and wherein the alarm data relates to a frequency disturbance alarm generated in response to a detection by the phasor measurement unit device of a difference in a frequency associated with the power grid system.

\* \* \* \* \*